(12) United States Patent
Kittayawanich et al.

(10) Patent No.: US 12,308,012 B2
(45) Date of Patent: May 20, 2025

(54) PIEZOELECTRIC SOUNDING COMPONENT

(71) Applicant: Murata Manufacturing Co., Ltd., Nagaokakyo (JP)

(72) Inventors: Sahutboon Kittayawanich, Chiang mai (TH); Pongsakorn Surintum, Lamphun (TH)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 386 days.

(21) Appl. No.: 17/658,523

(22) Filed: Apr. 8, 2022

(65) Prior Publication Data

US 2022/0230612 A1 Jul. 21, 2022

Related U.S. Application Data

(63) Continuation of application No. PCT/JP2020/035548, filed on Sep. 18, 2020.

(30) Foreign Application Priority Data

Feb. 3, 2020 (JP) ................................. 2020-016235

(51) Int. Cl.
*G10K 9/122* (2006.01)
*H04R 17/00* (2006.01)
*H10N 30/87* (2023.01)
*H10N 30/88* (2023.01)

(52) U.S. Cl.
CPC ............. *G10K 9/122* (2013.01); *H04R 17/00* (2013.01); *H10N 30/87* (2023.02); *H10N 30/883* (2023.02)

(58) Field of Classification Search
CPC ........ G10K 9/122; G10K 13/00; H04R 17/00; H04R 1/02; H04R 1/025; H10N 30/883; H10N 30/87
USPC ......................................... 381/173, 398, 386
See application file for complete search history.

(56) References Cited

U.S. PATENT DOCUMENTS

| 5,625,248 A | * | 4/1997 | Saito | ....................... G10K 9/122 310/355 |
| 6,922,475 B2 | * | 7/2005 | Hsieh | ....................... H04R 1/08 381/361 |

FOREIGN PATENT DOCUMENTS

| CN | 109429155 A | * | 3/2019 |
| JP | H07114383 A | | 5/1995 |
| JP | 2019040138 A | | 3/2019 |

OTHER PUBLICATIONS

International Search Report issued for PCT/JP2020/035548, date of mailing Dec. 15, 2020.

* cited by examiner

*Primary Examiner* — Norman Yu
(74) *Attorney, Agent, or Firm* — ArentFox Schiff LLP

(57) ABSTRACT

A piezoelectric sounding component includes a diaphragm, a case having a case body and a lid, and two pin terminals disposed on the lid such that the two pin terminals are in contact with the diaphragm. At least one of the pin terminals includes an extended portion, an extension portion, a rising portion, and a contact portion. A first fixing portion fixes the position of a first bent portion and a first guide portion that is in contact with a second bent portion and that guides posture of the pin terminal are on a surface of the lid that faces the interior space.

20 Claims, 12 Drawing Sheets

PIEZOELECTRIC SOUNDING COMPONENT

CROSS REFERENCE TO RELATED APPLICATIONS

The present application is a continuation of PCT/JP2020/035548 filed Sep. 18, 2020, which claims priority to Japanese Patent Application No. 2020-016235, filed Feb. 3, 2020, the entire contents of each of which are incorporated herein by reference.

TECHNICAL FIELD

The present invention relates to a piezoelectric sounding component.

BACKGROUND

Currently, piezoelectric sounding components are used as electroacoustic transducers that produce an alarm sound or an operation sound in, for example, household appliances, electronic devices for consumer use and business use such as fire alarm equipment, or automobiles. Among the piezoelectric sounding components, a piezoelectric sounding component that includes a needle-shaped mount terminal called a pin type includes, for example, a piezoelectric diaphragm, a base, a case that is fitted onto an outer side portion of the base and that contains the piezoelectric diaphragm together with the base. The piezoelectric diaphragm, an outer circumferential portion of which is put between the base and the case, is held in an interior space that is formed between a bottom wall portion of the base and a top wall portion of the case.

For example, Japanese Unexamined Patent Application Publication No. 7-114383 (hereinafter "Patent Document 1") discloses a piezoelectric sounding component that includes a piezoelectric diaphragm, a case that includes a case body having an opening and a back cover fixed to the case body such that the back cover closes the opening of the case body and that contains the piezoelectric diaphragm, and a pair of metal terminals that is fixed to the back cover, that is electrically connected to the piezoelectric diaphragm, and that extends from the case to the outside. Moreover, each metal terminal includes a terminal extended portion that extends from the case through the back cover to the outside, a terminal fixing portion that is bent with respect to the terminal extended portion at an end portion of the terminal extended portion facing an inner surface of the back cover and that is disposed along the inner surface of the back cover, and a connecting portion that is bent from an inner end of the terminal fixing portion such that a bent portion has a substantially U-shape when viewed from above and such that a front end is separated from the inner surface of the back cover, and that is in contact with the piezoelectric diaphragm.

As for the piezoelectric sounding component of a pin type disclosed in Patent Document 1, the front end of each pin-shaped metal terminal is in contact with an electrode due to the action of appropriate pressure, and electrical connection thereof is achieved. When such a structure is inserted in a mounting substrate, a portion of the metal terminal that is located outside a case is cut, and because of this, stress is applied to a portion of the metal terminal on which a process such as cutting is performed. Under the influence of the stress, the metal terminal rotates (i.e., misalignment), and a portion of the metal terminal that is located inside the case is misaligned in some cases. For this reason, the state of contact between the front end of the metal terminal and the piezoelectric diaphragm changes in some cases.

Consequently, there is a possibility that sounding characteristics of the piezoelectric sounding component vary, and that a sound impairment due to the failure of contact between the pin-shaped metal terminal and the piezoelectric diaphragm occurs.

SUMMARY OF THE INVENTION

Accordingly, it is an object of the present invention to provide a piezoelectric sounding component that can have good reliability.

In an exemplary aspect, a piezoelectric sounding component is provided that includes a diaphragm that vibrates when a voltage is applied thereto, a case that includes a case body having an opening and a lid disposed such that the lid closes the opening of the case body and that contains the diaphragm in an interior space that is formed by the case body and the lid, and two pin terminals that are disposed on the lid such that the two pin terminals are in contact with the diaphragm. At least one of the pin terminals includes an extended portion that extends from the interior space to an outside, an extension portion that extends along a main surface of the lid in the interior space, a rising portion that rises from the extension portion, and a contact portion that is disposed at an end of the rising portion and that is in contact with the diaphragm. Moreover, a fixing portion that fixes a position of a first bent portion between the extended portion and the extension portion and a guide portion that is in contact with a second bent portion between the extension portion and the rising portion or a portion near the second bent portion and that guides posture of the pin terminals are on a surface of the lid that faces the interior space.

According to the exemplary aspects of the present invention, a piezoelectric sounding component is provided having good reliability.

DETAILED DESCRIPTION OF EMBODIMENTS

Exemplary embodiments of the present invention will hereinafter be described. In the following description of the drawings, like or similar components are designated by like or similar reference signs. The drawings are example, the dimensions and shapes of components are schematically illustrated, and it should not be understood that the technical scope of the present invention is limited by the embodiments.

First Exemplary Embodiment

<Piezoelectric Sounding Component 1>

Figure 1:
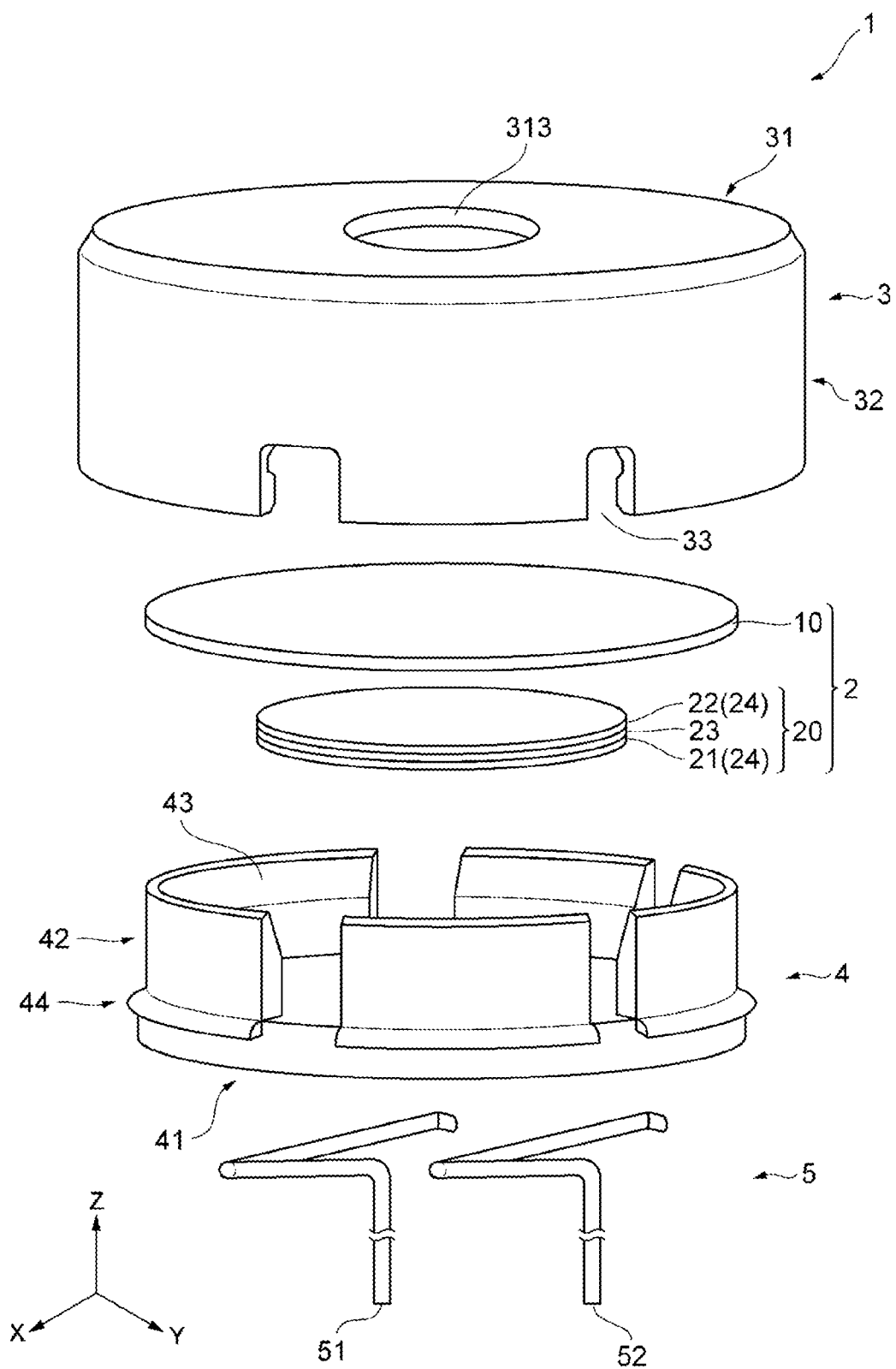
FIG. 1 is an exploded perspective view for describing the structure of a piezoelectric sounding component according to a first exemplary embodiment.
Figure 2:
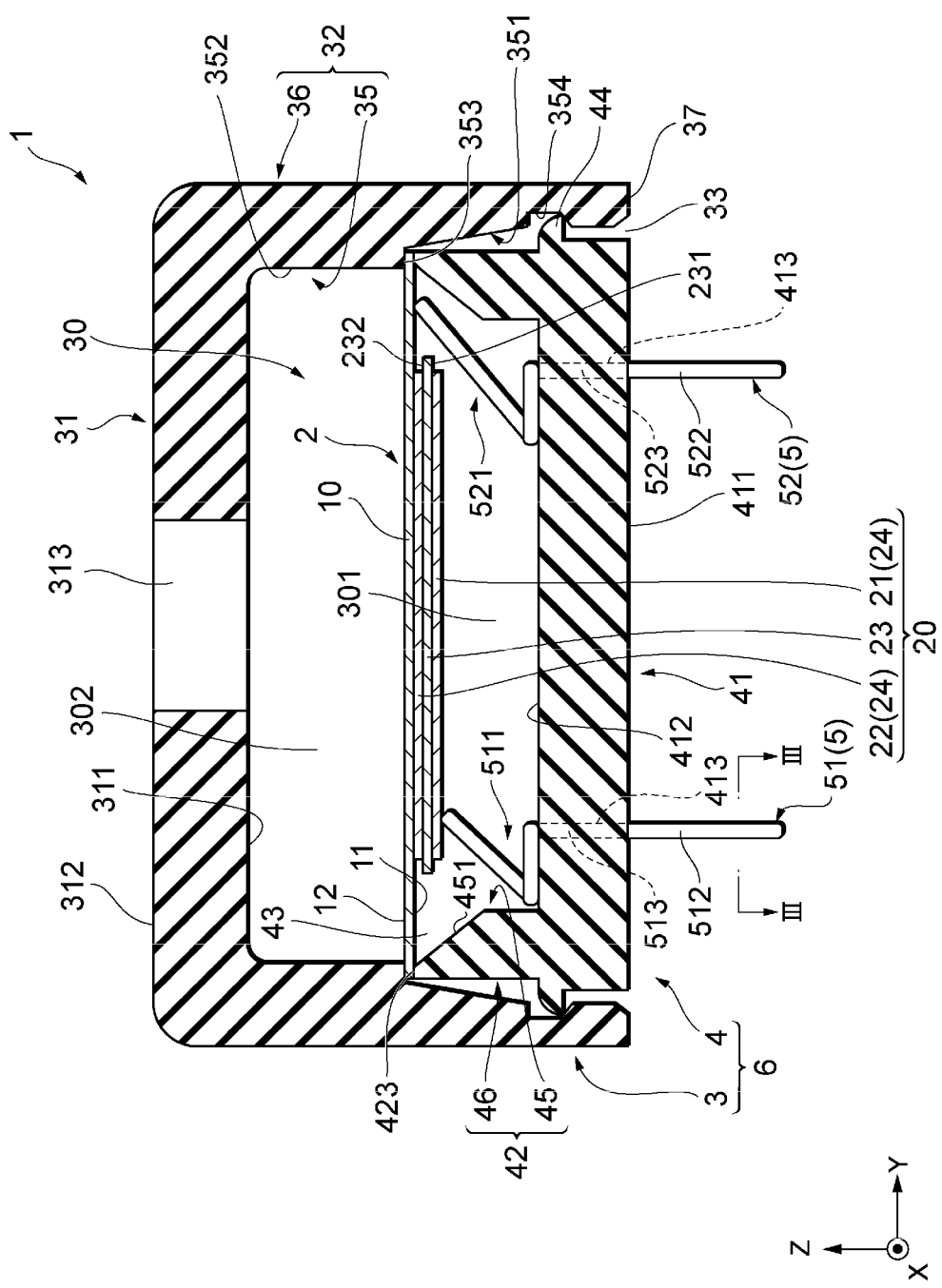
FIG. 2 is a sectional view for describing the structure of the piezoelectric sounding component according to the first exemplary embodiment.

The structure of a piezoelectric sounding component 1 according to a first embodiment will now be described with reference to FIG. 1 and FIG. 2. FIG. 1 is an exploded perspective view for describing the structure of the piezoelectric sounding component 1 according to the first embodiment. FIG. 2 is a sectional view for describing the structure of the piezoelectric sounding component 1 according to the first embodiment. In FIG. 1 and FIG. 2, an exemplary structure is provided for describing at least a part of features of the structure of the piezoelectric sounding component 1 is extracted and illustrated. However, the piezoelectric sounding component 1 is not prevented from including a different structure than that which is illustrated.

In general, the piezoelectric sounding component 1 is an example of a sound component of a pin type and includes a diaphragm 2, a case 6 that contains the diaphragm 2, and two pin terminals 5 that, in operation, apply a voltage to the diaphragm 2 with the two pin terminals 5 being in contact with the diaphragm 2.

As shown, the case 6 includes a case body 3 and a lid 4. The lid 4 is mounted on the case body 3 so as to close the opening of the case body 3 and consequently forms the case 6. The case 6 has an interior space 30 that is formed by surfaces of the case body 3 and the lid 4 that face a portion inside the case 6.

For convenience of description, a state in which the diaphragm 2, the case body 3, the lid 4, and the two pin terminals 5 are assembled into the piezoelectric sounding component 1 is referred to below as the "state of assembly". In the state of assembly, the plane direction of each structure in the piezoelectric sounding component 1 is referred to as an "XY plane", and the direction perpendicular to the plane direction of the structure, that is, the direction perpendicular to the XY plane is referred to as a "Z-direction" in some cases. As for the case where the structure of the piezoelectric sounding component 1 or the diaphragm 2 is viewed in the thickness direction of, for example, the piezoelectric sounding component 1 or the diaphragm 2 in a plan view, the shape of, for example, the diaphragm 2 in a plan view is referred to as a "shape in a plan view". As for the Z-direction in the state of assembly, as illustrated in FIG. 2, a direction from the case body 3 toward the lid 4 is referred to as a "first direction", and a direction from the lid 4 toward a top wall portion 31 of the case body 3 described later is referred to as a "second direction" in some cases.

According to the first embodiment, the diaphragm 2, the case body 3, and the lid 4 each have a circular shape in a plan view. In the state of assembly, the diaphragm 2, the case body 3, and the lid 4 are arranged such that the circle center of each shape in a plan view is substantially aligned along a straight line, i.e., in the Z-direction.

According to the first embodiment, the diaphragm 2 is installed (e.g., contained or disposed) in the case body 3, the lid 4 subsequently closes the opening (a cavity 33 described later) of the case body 3 and fixes the diaphragm 2 together with the case body 3 (a support surface 353 described later) with the diaphragm 2 disposed therebetween. In this way, the diaphragm 2 is contained in the interior space 30 of the case 6. In the state of assembly, the two pin terminals 5 are disposed on the lid 4, and front ends that are located in the interior space 30 are in contact with the diaphragm 2.

(Diaphragm 2)

The diaphragm 2 includes a substrate 10 and a vibration element 20. The vibration element 20 is stuck on a central portion of a main surface (e.g., a first substrate main surface 11 described later) of the substrate 10 that faces in the first direction by using a conductive adhesive. The substrate 10 and the vibration element 20 are disk-shaped components. The diameter of the substrate 10 is larger than the diameter of the vibration element 20.

The substrate 10 is composed of a metal material having good conductivity and elasticity (for example, an elastic modulus of 1 GPa or more). Specifically, the substrate 10 is preferably composed of 42 alloy, SUS (stainless steel), brass, phosphor bronze, or another material. In an exemplary aspect, the material of the substrate 10 can be a resin material such as a glass epoxy substrate other than metal, for example, provided that the elastic modulus is 1 GPa or more and may have a multilayer structure of multiple materials that are stacked.

The substrate 10 has the first substrate main surface 11 and a second substrate main surface 12 that are located as both sides in the thickness direction. In the state of assembly, the first substrate main surface 11 faces in the first direction, and the second substrate main surface 12 faces in the second direction.

The vibration element 20 includes a piezoelectric plate 23 and two electrodes 24 that are disposed on both main surfaces of the piezoelectric plate 23 and that put the piezoelectric plate 23 therebetween.

Moreover, the piezoelectric plate 23 is composed of piezoelectric ceramics such as PZT. The piezoelectric plate 23 is a disk-shaped component and has a first main surface 231 and a second main surface 232 that are located as both sides in the thickness direction. In the state of assembly, the first main surface 231 faces in the first direction, and the second main surface 232 faces in the second direction.

In operation, the two electrodes 24 apply a voltage to the piezoelectric plate 23 and consequently causes the diaphragm 2 to vibrate. The two electrodes 24 include a first electrode 21 and a second electrode 22. Moreover, the first electrode 21 and the second electrode 22 are circular thin films. In the state of assembly, the first electrode 21 is disposed on the first main surface 231 of the piezoelectric plate 23, and the second electrode 22 is disposed on the second main surface 232 of the piezoelectric plate 23.

In other words, the first electrode 21 faces the lid 4, and the second electrode faces the substrate 10. The first electrode 21 is in contact with a pin terminal 5 of the two pin terminals 5.

(Case Body 3)

The case body 3 is composed of an insulating material, such as ceramics or resin, and has a box shape in an exemplary aspect. The case body 3 includes the top wall portion 31, a surrounding wall portion 32 that projects from the circumferential edge of the top wall portion 31, and the cavity 33 that opens at a front end position on the surrounding wall portion 32 in a direction in which the surrounding wall portion 32 projects.

Moreover, the top wall portion 31 has a disk shape. The top wall portion 31 has a first top wall main surface 311 and a second top wall main surface 312 that are located as both sides in the thickness direction. In the state of assembly, the first top wall main surface 311 faces in the first direction, and the second top wall main surface 312 faces in the second direction.

A tone hole 313 is formed at the center of the top wall portion 31. The tone hole 313 extends through the top wall portion 31 in the thickness direction (i.e., the Z-direction) and connects a portion inside the case body 3 to the outside. In this way, in the state of assembly, a sound that is produced when the diaphragm 2 vibrates is emitted from the case 6 to the outside through the tone hole 313.

The surrounding wall portion 32 has a cylindrical shape. The surrounding wall portion 32 has an inner circumferential surface 35 and an outer circumferential surface 36. For purposes of this description, the direction in which the surrounding wall portion 32 protrudes from the top wall portion 31 is referred to below as a "protrusion direction", a position on the top wall portion 31 in the protrusion direction is referred to below as a "root position", and a position on the cavity 33 in the protrusion direction is referred to below as the "front end position". Moreover, a part of the surrounding wall portion 32 at the root position is referred to as a "root portion", and a part of the surrounding wall portion 32 at the front end position is referred to as a "front end portion".

The inner circumferential surface 35 includes a second inner circumferential surface 352 and a first inner circumferential surface 351 that are arranged in this order from the root position on the surrounding wall portion 32 in the protrusion direction toward the front end position. Moreover, the inner circumferential surface 35 includes the support surface 353 that connects the second inner circumferential surface 352 and the first inner circumferential surface 351 to each other and that is parallel to the top wall portion 31. In other words, the support surface 353 is a step surface between the second inner circumferential surface 352 and the first inner circumferential surface 351.

The support surface 353 is a surface that comes into contact with the second substrate main surface 12 of the substrate 10 of the diaphragm 2 when the diaphragm 2 is contained. Specifically, the support surface 353 supports the diaphragm 2 together with an upper surface 423 of the lid 4 described later with the diaphragm 2 put therebetween in the thickness direction. The shape of the support surface 353 in a plan view is a ring shape, the diameter of an outer circumferential edge is larger than the diameter of the substrate 10, and the diameter of an inner circumferential edge is smaller than the diameter of the substrate 10.

As for the second inner circumferential surface 352, the root portion is connected to the top wall portion 31, and the front end portion is connected to the inner circumference of the support surface 353. The second inner circumferential surface 352 forms an acoustic space 302 that is located in the second direction in the interior space 30 together with the first top wall main surface 311.

As for the first inner circumferential surface 351, the root portion is connected to the outer circumferential edge of the support surface 353, and the front end portion is connected to an upper surface 37 of the surrounding wall portion 32. In the state of assembly, that is, a state in which the lid 4 is mounted on the case body 3, the first inner circumferential surface 351 forms a space in which the lid 4 is contained. In addition, a groove portion 354 for engagement with a pawl portion 44 of the lid 4 described later is formed at the front end position on the first inner circumferential surface 351.

(Lid 4)

In an exemplary aspect, the lid 4 is composed of, for example, the same material as the case body 3, that is, an insulating material such as ceramics or resin. The lid 4 has a box shape. The lid 4 includes a top wall portion 41, a surrounding wall portion 42 that protrudes from the circumferential edge of the top wall portion 41, and a cavity 43 that opens at the front end position in a direction in which the surrounding wall portion 42 protrudes.

For purposes of this description, the direction in which the surrounding wall portion 42 protrudes from the top wall portion 41 is referred to below as a "protrusion direction", a position on the top wall portion 41 in the protrusion direction is referred to below as a "root position", and a position on the cavity 43 in the protrusion direction is referred to below as a "front end position". A part of the surrounding wall portion 42 at the root position is referred to as a "root portion", and a part of the surrounding wall portion 42 at the front end position is referred to as a "front end portion". In the state of assembly, as illustrated in FIG. 2, the "root position (the root portion)" and the "front end position (the front end portion)" related to the lid 4 are opposite the "root position (the root portion)" and the "front end position (the front end portion)" related to the case body 3 described above.

In the exemplary aspect, the top wall portion 41 has a disk shape. The top wall portion 41 has a first top wall main surface 411 and a second top wall main surface 412 that are located as both sides in the thickness direction. In the state of assembly, the first top wall main surface 411 faces in the first direction, and the second top wall main surface 412 faces in the second direction.

Moreover, the top wall portion 41 has two through-holes 413 for receiving/fixing the two pin terminals 5. The through-holes 413 extend through the top wall portion 41 in the thickness direction and connect a portion inside the lid 4 to the outside.

A fixation guide structure 100 (see, e.g., FIG. 5) for position fixation and posture guide of the two pin terminals 5 is disposed on the second top wall main surface 412 of the top wall portion 41. The fixation guide structure 100 will be described in detail later.

The surrounding wall portion 42 has a cylindrical shape. The surrounding wall portion 42 has an inner circumferential surface 45 and an outer circumferential surface 46. In the state of assembly, the inner circumferential surface 45 of the surrounding wall portion 42 forms an acoustic space 301 that is located in the second direction in the interior space 30 together with the second top wall main surface 412.

A clearance 451 for preventing the inner circumferential surface 45 from interfering with installation of the two pin terminals 5 and movement of the two pin terminals 5 in the state of assembly is formed on the inner circumferential surface 45 at a part of the surrounding wall portion 42 that faces the upper surface 423.

The pawl portion 44 is disposed at the root position of the outer circumferential surface 46. During assembly, the pawl portion 44 is pushed into the groove portion 354 of the case body 3 and consequently engages with the groove portion 354 of the case body 3. In this way, the lid 4 is mounted on the case body 3 by engaging the pawl portion 44 and the groove portion 354 with each other, and the case 6 is formed by closing the cavity 33 of the case body 3.

(Pin Terminal 5)

The two pin terminals 5 include a first pin terminal 51 and a second pin terminal 52. The first pin terminal 51 and the second pin terminal 52 are formed by folding respective lead wires the cross-sectional shape of which is substantially circular. This configuration of a folded shape enables the first pin terminal 51 and the second pin terminal 52 to have springiness.

In the state of assembly, the first pin terminal 51 and the second pin terminal 52 are mounted on the lid 4 with the fixation guide structure 100 and the two through-holes 413 that are formed in the top wall portion 41 of the lid 4 interposed therebetween.

In the state of assembly, the first pin terminal 51 and the second pin terminal 52 are in contact with the diaphragm 2 and are electrically connected to the diaphragm 2. Specifically, as illustrated in FIG. 2, the first pin terminal 51 is in contact with the first electrode 21 of the diaphragm 2, and the second pin terminal 52 is in contact with the substrate 10 of the diaphragm 2. According to the first embodiment, the shape of the first pin terminal 51 and the shape of the second pin terminal 52 differ from each other. The first pin terminal 51 and the second pin terminal 52 will be described in detail later.

As for the piezoelectric sounding component 1 according to the first embodiment, an alternating voltage is applied in operation to the first electrode 21 and the second electrode 22 of the diaphragm 2 via the first pin terminal 51 and the second pin terminal 52, and the diaphragm 2 then vibrates in the acoustic space 301 and the acoustic space 302 so as to reciprocate in the first direction and the second direction and sounds (e.g., rumbles). The produced sound is emitted from the case 6 to the outside mainly via the tone hole 313.

<Detail of First Pin Terminal 51 and Second Pin Terminal 52>

Figure 3:
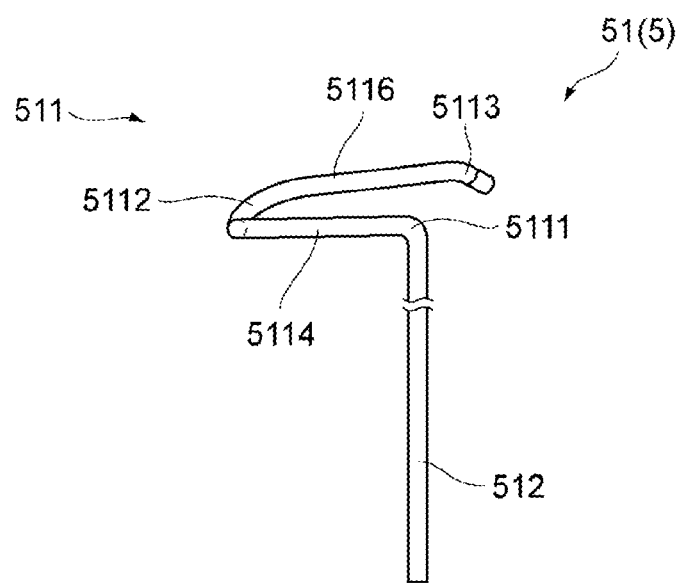
FIG. 3 is a diagram for describing the structure of a pin terminal according to the first exemplary embodiment.
Figure 4:
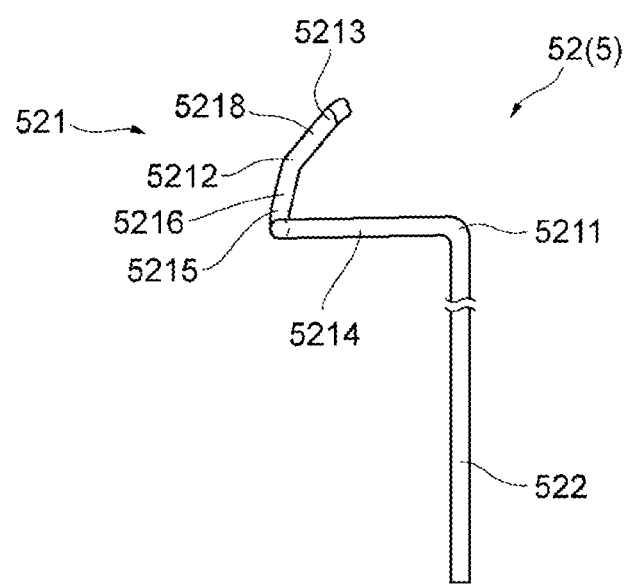
FIG. 4 is a diagram for describing the structure of another pin terminal according to the first exemplary embodiment.

The first pin terminal 51 and the second pin terminal 52 will now be described in detail with reference to FIG. 3 and FIG. 4. FIG. 3 is a diagram for describing the structure of the first pin terminal 51 according to the first embodiment. FIG. 4 is a diagram for describing the structure of the second pin terminal 52 according to the first embodiment.

For purposes of this description, end portions of the two pin terminals 5 that are located near the cavity 43 are referred to below as "front ends", and end portions that are located outside the case 6 are referred to below as "rear ends" in some cases. The directions of the lead wires that form the respective two pin terminals 5 are referred to as "lead wire extension directions", and directions from rear ends in the lead wire extension directions regarding portions of the two pin terminals 5 toward the front end position are referred to as "extension directions" in some cases.

(Structure of First Pin Terminal 51)

As illustrated in FIGS. 2 and 3, the first pin terminal 51 includes a terminal body 511, a mount portion 513, and an extended portion 512 as seen in the lead wire extension direction of the first pin terminal 51. The extension directions of the mount portion 513 and the extended portion 512 are the same. The extension direction of the terminal body 511 differs from the extension directions of the mount portion 513 and the extended portion 512.

In the state of assembly, the terminal body 511 is located in the acoustic space 301 of the interior space 30, and the front end thereof is in contact with the first electrode 21 of the diaphragm 2. The mount portion 513 is inserted in the through-hole 413 of the lid 4. The extended portion 512 extends from the interior space 30 to the outside and is to be mounted on an external substrate (not illustrated).

As illustrated in FIG. 3, the terminal body 511 has a substantially U-shape. Specifically, the terminal body 511 includes a first bent portion 5111, an extension portion 5114 that straightly extends, a second bent portion 5112, a rising portion 5116 that straightly extends, and a contact portion 5113 in the lead wire extension direction.

The first bent portion 5111 is connected to the mount portion 513. The first bent portion 5111 connects the mount portion 513 and the extended portion 512 to the extension portion 5114. The extension direction of the extension portion 5114 intersects the extension directions of the mount portion 513 and the extended portion 512 due to the first bent portion 5111. According to the first embodiment, the extension direction of the extension portion 5114 is substantially perpendicular to the extension directions of the mount portion 513 and the extended portion 512.

In the exemplary aspect, the proportion of bend of the second bent portion 5112 is smaller than that of the first bent portion 5111. The second bent portion 5112 connects the extension portion 5114 and the rising portion 5116 to each other. The extension direction of the rising portion 5116 is opposite the extension direction of the extension portion 5114 due to the second bent portion 5112. In addition, the rising portion 5116 rises from the extension portion 5114 due to the second bent portion 5112.

In the state of assembly of the terminal body 511, the extension portion 5114 extends substantially along the second top wall main surface 412 of the lid 4 due to the first bent portion 5111. A part of the second bent portion 5112 at a rear end position is in contact with the second top wall main surface 412 and another part at the front end position rises from the second top wall main surface 412. In other words, the terminal body 511 starts to tilt from the second bent portion 5112 with respect to the second top wall main surface 412 in the second direction of a Z-axis. The rising portion 5116 rises from the second top wall main surface 412 of the lid 4 due to the second bent portion 5112. In this way, the extension portion 5114, the second bent portion 5112, and the rising portion 5116 form a spring structure of the first pin terminal 51. With the spring structure of the first pin terminal 51, the contact portion 5113 is in contact with the first electrode 21 of the diaphragm 2 as shown in FIG. 2.

(Structure of Second Pin Terminal 52)

As illustrated in FIGS. 2 and 4, the second pin terminal 52 includes a terminal body 521, a mount portion 523, and an extended portion 522 as seen in the lead wire extension direction of the second pin terminal 52. The extension directions of the mount portion 523 and the extended portion 522 are the same. The extension direction of the terminal body 521 differs from the extension directions of the mount portion 523 and the extended portion 522.

In the state of assembly, the terminal body 521 is located in the acoustic space 301 of the interior space 30, and the front end thereof is in contact with the substrate 10 of the diaphragm 2. The mount portion 523 is inserted in the through-hole 413 of the lid 4. The extended portion 522 extends from the interior space 30 to the outside and is to be mounted on the external substrate (not illustrated).

As illustrated in FIG. 4, the terminal body 521 has a substantially L-shape. Specifically, the terminal body 521 includes a first bent portion 5211, an extension portion 5214 that straightly extends, a third bent portion 5215, a rising portion 5216 that straightly extends, a second bent portion 5212, a rising portion 5218 that straightly extends, and a contact portion 5213 in the lead wire extension direction.

The first bent portion 5211 is connected to the mount portion 523. The first bent portion 5211 connects the mount portion 523 and the extended portion 522 to the extension portion 5214. The extension direction of the extension portion 5214 intersects the extension directions of the mount portion 523 and the extended portion 522 due to the first bent portion 5211. According to the first embodiment, the extension direction of the extension portion 5214 is substantially perpendicular to the extension directions of the mount portion 523 and the extended portion 522.

The third bent portion 5215 connects the extension portion 5214 and the rising portion 5216 to each other. The extension direction of the rising portion 5216 intersects the extension direction of the extension portion 5214 due to the third bent portion 5215. In addition, the rising portion 5216 rises from the extension portion 5214 due to the third bent portion 5215.

The second bent portion 5212 connects the rising portion 5216 and the rising portion 5218 to each other. The extension direction of the rising portion 5218 intersects the extension direction of the rising portion 5216 due to the second bent portion 5212. In addition, the rising portion 5218 rises from the rising portion 5216 due to the second bent portion 5212.

In the state of assembly of the terminal body 521, the extension portion 5214 extends substantially along the second top wall main surface 412 of the lid 4 due to the first bent portion 5211. In addition, a part of the third bent portion 5215 at the rear end position is in contact with the second top wall main surface 412, and another part at the front end position rises from the second top wall main surface 412. In other words, the terminal body 521 starts to tilt from the third bent portion 5215 with respect to the second top wall main surface 412 in the second direction of the Z-axis. The third bent portion 5215 is in contact with a recessed portion of the inner circumferential surface 45 of the lid 4. The rising portion 5216 and the rising portion 5218 are formed along the inner circumferential surface 45 of the lid 4 due to the second bent portion 5212 and rises from the second top wall main surface 412 of the lid 4 due to the third bent portion 5215 and the second bent portion 5212. In this way, the extension portion 5214, the third bent portion 5215, the rising portion 5216, the second bent portion 5212, and the rising portion 5218 form a spring structure of the second pin terminal 52. With the spring structure of the second pin terminal 52, the contact portion 5213 is in contact with the substrate 10 of the diaphragm 2. For this reason, the contact portion 5213 of the second pin terminal 52 is connected to the second electrode 22 of the diaphragm 2 with the substrate 10 interposed therebetween.

<Detail of Fixation Guide Structure 100 of Lid 4>

Figure 5:
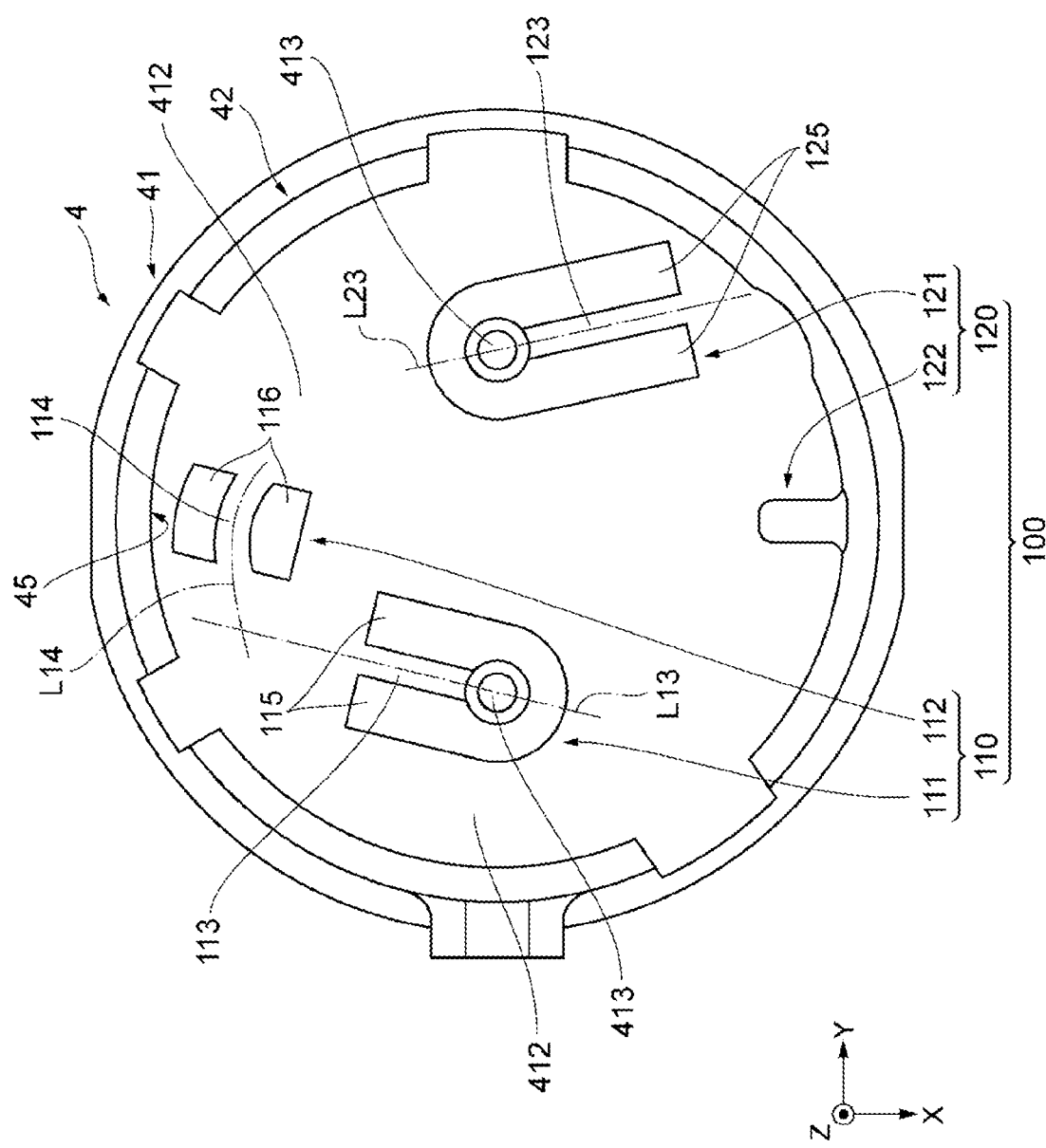
FIG. 5 is a diagram for describing a fixation guide structure of a lid according to the first exemplary embodiment.
Figure 6:
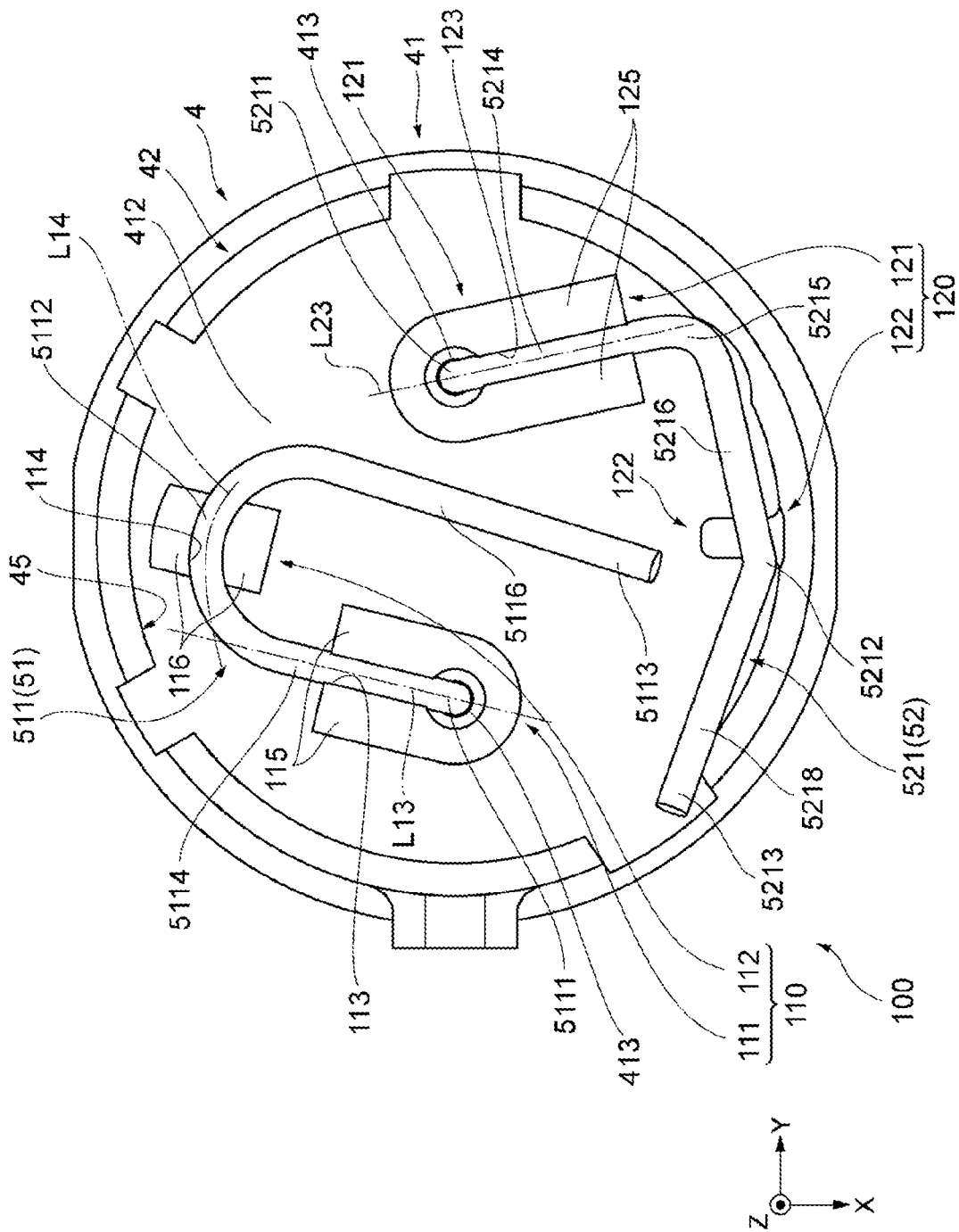
FIG. 6 is a diagram for describing the state of assembly of the pin terminals and the lid according to the first exemplary embodiment.
Figure 11:
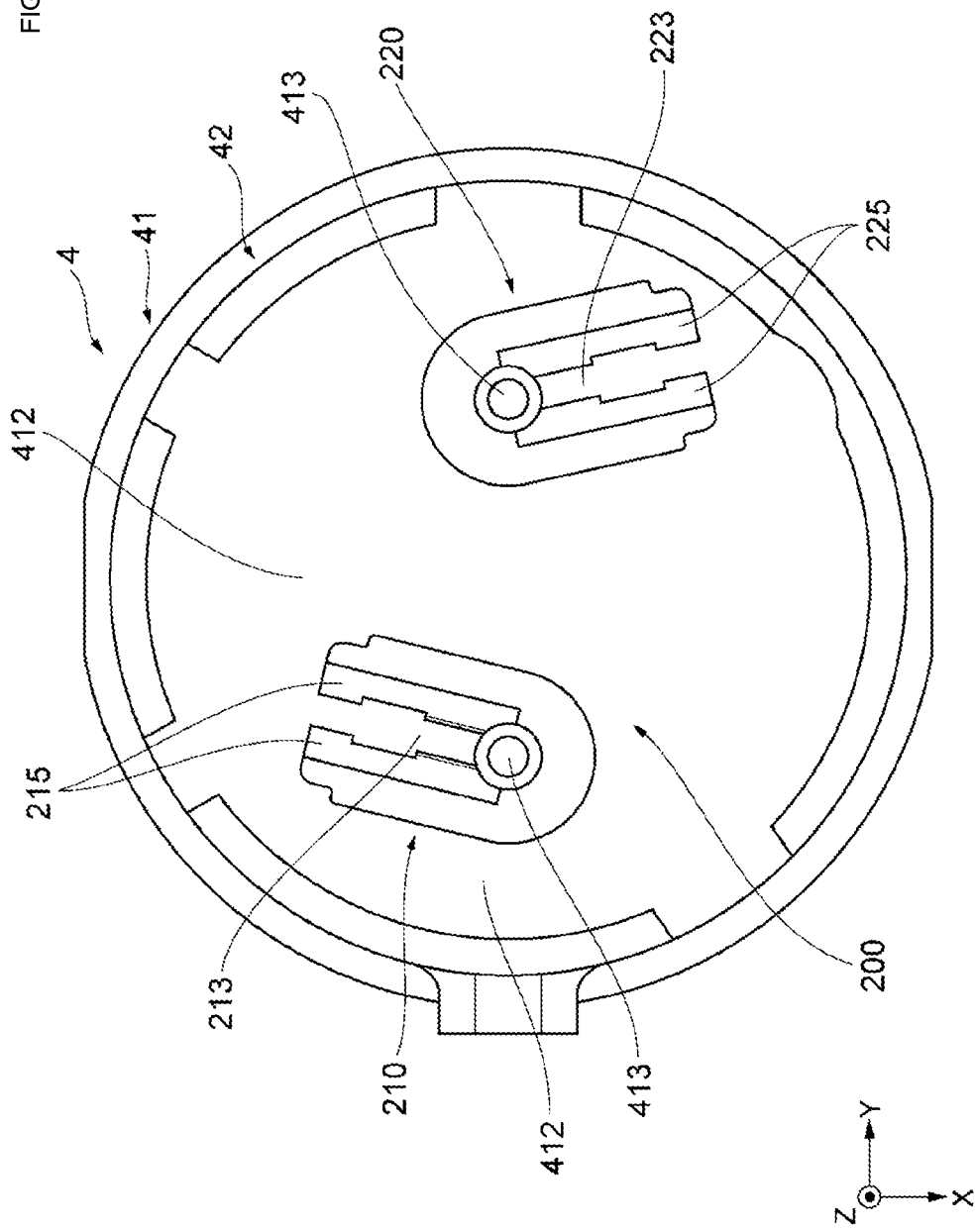
FIG. 11 is a diagram for describing the structure of fixing portions of a lid in a comparative example.
Figure 12:
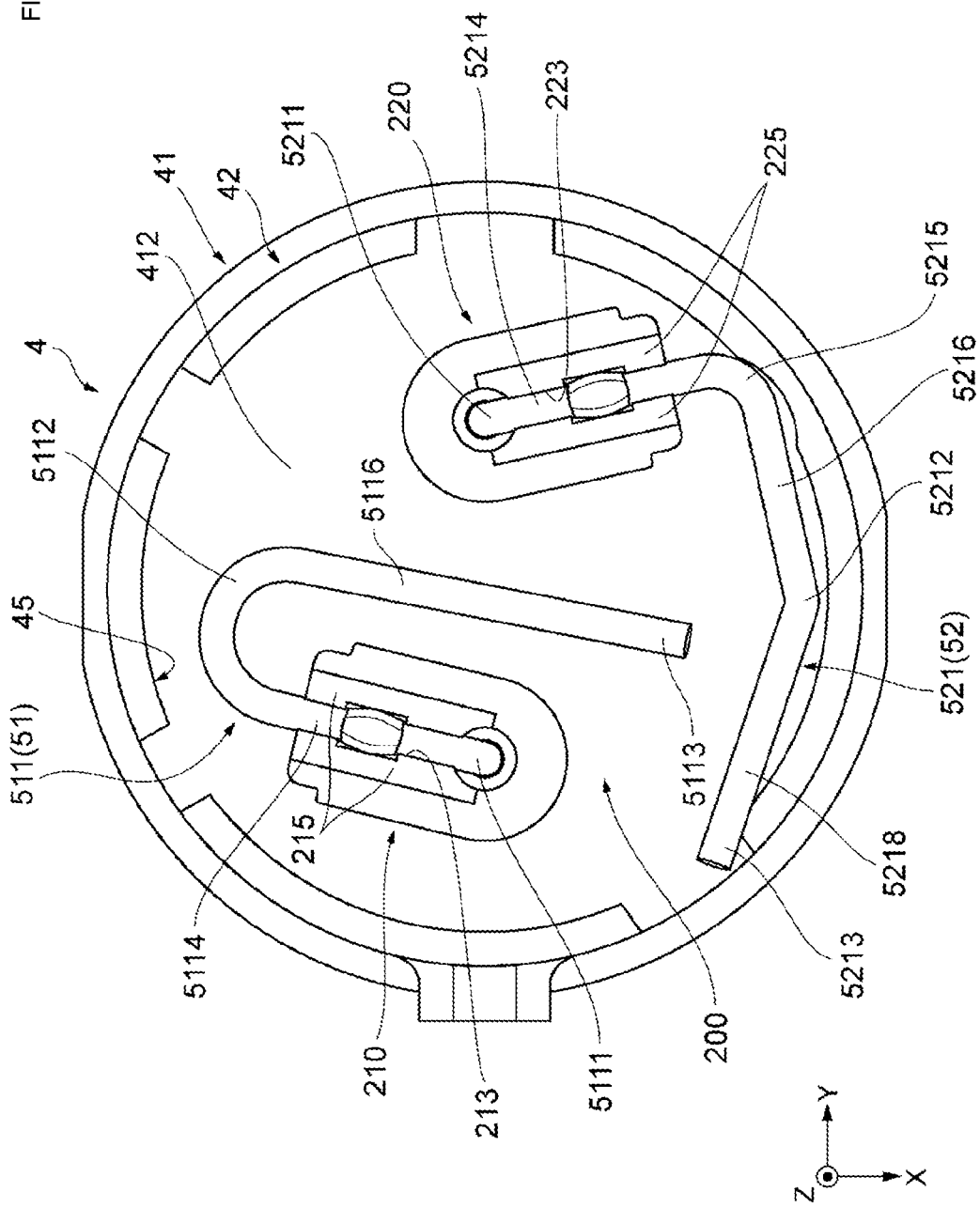
FIG. 12 is a diagram for describing the state of assembly of pin terminals and the lid in the comparative example.

The fixation guide structure 100 of the lid according to the first embodiment will now be described in detail with reference to FIG. 5, FIG. 6, FIG. 11, and FIG. 12. FIG. 5 is a diagram for describing the fixation guide structure 100 of the lid 4 according to the first embodiment. FIG. 6 is a diagram for describing the state of assembly of the two pin terminals 5 and the lid 4 according to the first embodiment. FIG. 11 is a sectional view for describing the structure of a first fixing portion 210 and a second fixing portion 220 of the lid 4 in a comparative example. FIG. 12 is a diagram for describing the state of assembly of the two pin terminals 5 and the lid 4 in the comparative example.

(Structure of Fixation Guide Structure 100)

The structure of the fixation guide structure 100 will now be described with reference to FIG. 5. As illustrated in FIG. 5, the fixation guide structure 100 is disposed so as to protrude from the second top wall main surface 412 of the lid 4. According to the first embodiment, the fixation guide structure 100 includes a first fixation guide structure 110 for position fixation and posture guide of the first pin terminal 51 and a second fixation guide structure 120 for position fixation and posture guide of the second pin terminal 52.

The first fixation guide structure 110 includes a first fixing portion 111 that fixes the position of the first bent portion 5111 of the first pin terminal 51 and a first guide portion 112 that is in contact with the second bent portion 5112 of the first pin terminal 51 and that guides the posture of the first pin terminal 51.

As seen from the perspective that the orientation of the contact portion 5113 of the first pin terminal 51 is maintained, the first fixation guide structure 110 includes the first fixing portion 111 that directs the orientation of the contact portion 5113 in a plan view of the second top wall main surface 412 of the lid 4 and the first guide portion 112 that directs the orientation of the contact portion 5113 in the direction intersecting the second top wall main surface 412 of the lid 4.

In a plan view, the first fixing portion 111 and the first guide portion 112 are disposed at different positions on the lid 4. The first guide portion 112 is disposed at a position nearer than the first fixing portion 111 to the circumferential edge of the second top wall main surface 412 of the lid 4.

The first fixing portion 111 is disposed around the opening of the through-hole 413 of the lid 4. As shown, the first fixing portion 111 has a U-shape in a plan view. A U-shaped opening is formed so as to approach the circumferential edge of the second top wall main surface 412 that is located near the first guide portion 112. The first fixing portion 111 includes two wall portions 115 and has a gap 113 that is formed between the two wall portions 115. The gap 113 is an example of a fixing portion gap. In a plan view, the center line L13 of the gap 113 passes through the through-hole 413.

The first guide portion 112 is disposed near the circumferential edge of the second top wall main surface 412 of the lid 4 at a position away from a line on which the gap 113 extends. In other words, the first guide portion 112 is formed near the inner circumferential surface 45 of the lid 4. The first guide portion 112 has a block shape in a plan view. The first guide portion 112 includes two wall portions 116 and has a gap 114 that is formed between the two wall portions 116. The gap 114 is an example of a guide portion gap. In a plan view, the center line L14 of the gap 114 bends. The center line L14 of the gap 114 intersects the center line L13 of the gap 113.

The second fixation guide structure 120 includes a second fixing portion 121 that fixes the position of the first bent portion 5211 of the second pin terminal 52 and a second guide portion 122 that is in contact with the rising portion 5216 located near the second bent portion 5212 of the second pin terminal 52 and that guides the posture of the second pin terminal 52.

As seen from the perspective that the orientation of the contact portion 5213 of the second pin terminal 52 is maintained, the second fixation guide structure 120 includes the second fixing portion 121 that directs the orientation of the contact portion 5213 in a plan view of the second top wall main surface 412 of the lid 4 and the second guide portion 122 that directs the orientation of the contact portion 5213 in the direction intersecting the second top wall main surface 412 of the lid 4.

In a plan view, the second fixing portion 121 and the second guide portion 122 are disposed at different positions on the lid 4. The second guide portion 122 is disposed at a position nearer than the second fixing portion 121 to the circumferential edge of the second top wall main surface 412 of the lid 4.

The second fixing portion 121 is disposed around the opening of the through-holes 413 of the lid 4. As further shown, the second fixing portion 121 has a U-shape in a plan view. A U-shaped opening is formed so as to approach the circumferential edge of the second top wall main surface 412 that is located near the second guide portion 122. The second fixing portion 121 includes two wall portions 125 and has a gap 123 that is formed between the two wall portions 125. The gap 123 is an example of the fixing portion gap. In a plan view, the center line L23 of the gap 123 passes through the through-hole 413.

The second guide portion 122 is disposed at the circumferential edge of the second top wall main surface 412 of the lid 4 at a position away from a line on which the gap 123 extends. In other words, the second guide portion 122 is formed so as to be in contact with the inner circumferential surface 45 of the lid 4. The second guide portion 122 has a block shape in a plan view. The second guide portion 122 has no gap.

(Assembly of Two Pin Terminals 5 and Lid 4)

Assembly of the two pin terminals 5 and the lid 4 will now be described with reference to FIG. 6. As illustrated in FIG. 6, the first pin terminal 51 and the second pin terminal 52 are mounted on the lid 4 by using the two through-holes 413 and the fixation guide structure 100.

When the first pin terminal 51 is installed on the lid 4, the mount portion 513 of the first pin terminal 51 is inserted into the through-hole 413. The terminal body 511 of the first pin terminal 51 is installed on the first fixing portion 111 and the first guide portion 112. Specifically, as illustrated in FIG. 6, a part of the extension portion 5114 and the first bent portion 5111 of the terminal body 511 are inserted into the gap 113 of the first fixing portion 111. The second bent portion 5112 is pushed into the gap 114 of the first guide portion 112.

After the first pin terminal 51 is installed on the lid 4, the two wall portions 115 of the first fixing portion 111 are crimped against each other so as to put the part of the extension portion 5114 and the first bent portion 5111 therebetween. The two wall portions 116 of the first guide portion 112 are crimped against each other so as to put the second bent portion 5112 therebetween.

After crimping, end portions of the two wall portions 115 are connected to each other, and end portions of the two wall portions 116 are also connected to each other. That is, the first fixing portion 111 and the first guide portion 112 each have a tunnel shape (not illustrated). For this reason, the part of the extension portion 5114 and the first bent portion 5111 are formed so as to be embedded in the first fixing portion 111. The part of the second bent portion is formed so as to be surrounded by the first guide portion 112.

When the second pin terminal 52 is installed on the lid 4, the mount portion 523 of the second pin terminal 52 is inserted into the through-hole 413. The terminal body 521 of the second pin terminal 52 is installed on the second fixing portion 121 and the second guide portion 122. Specifically, as illustrated in FIG. 6, a part of the extension portion 5214 and the first bent portion 5211 of the terminal body 521 are pushed into the gap 123 of the second fixing portion 121. A part near the second bent portion 5212, that is, the rising portion 5216 is disposed so as to be in contact with an end portion of the second guide portion 122. The third bent portion 5215 is in contact with the recessed portion of the inner circumferential surface 45 of the lid 4.

After the second pin terminal 52 is installed on the lid 4, the two wall portions 125 of the second fixing portion 121 are crimped against each other so as to put the part of the extension portion 5214 and the first bent portion 5211 therebetween. After crimping, end portions of the two wall portions 125 are connected to each other. That is, the second fixing portion 121 has a tunnel shape. For this reason, the part of the extension portion 5214 and the first bent portion 5211 are formed so as to be embedded in the second fixing portion 121. In addition, the second bent portion is supported by the second guide portion 122.

(Effects of Fixation Guide Structure 100)

The effects of the fixation guide structure 100 according to the first exemplary embodiment will now be described with reference to FIG. 2, FIG. 5, FIG. 6, FIG. 11, and FIG. 12 and compared with those of a fixation structure 200 in a comparative example. A difference between the fixation structure 200 in the comparative example and the fixation guide structure 100 according to the first embodiment is that the fixation structure 200 in the comparative example does not include the first guide portion 112 and the second guide portion 122 of the fixation guide structure 100 according to the first embodiment.

Some cases referred to below as "when stress is created" for convenience of description are the cases where, when the piezoelectric sounding component 1 is inserted into the mounting substrate, the extended portion 512 and the extended portion 522 of the two pin terminals 5 that are located outside the case 6 are cut, and because of, for example, this, stress is applied to portions of the two pin terminals 5 on which a process such as cutting is performed.

(Effects of First Fixing Portion 111 and First Guide Portion 112)

As for the first pin terminal 51, the position of the terminal body 511 with respect to the lid 4 is fixed by the first fixing portion 111 and the first guide portion 112, and the posture with respect to the lid 4 is guided by the first guide portion 112.

Specifically, in the exemplary aspect, the part of the extension portion 5114 and the first bent portion 5111 of the terminal body 511 are crimped by the two wall portions 115 of the first fixing portion 111. For this reason, when stress is created, movement (e.g., misalignment) of the terminal body 511 in the direction perpendicular to the center line L13 of the first fixing portion 111 is restricted on an XY place. The part of the second bent portion 5112 of the terminal body 511 is crimped by the two wall portions 116 of the first guide portion 112. For this reason, when stress is created, movement (e.g., misalignment) of the terminal body 511 in the direction perpendicular to the center line L14 of the first guide portion 112 is restricted on the XY plane.

Moreover, the center line L13 and the center line L14 intersect each other as described above. For this reason, when stress is created, movement (e.g., misalignment) of the terminal body 511 in the directions of XY axes with respect to the lid 4 is restricted by the first fixing portion 111 and the first guide portion 112. Consequently, in a plan view, the position of the terminal body 511 with respect to the lid 4 is fixed, and the orientation of the contact portion 5113 with respect to the lid 4 is maintained in a predetermined direction. In other words, the orientation of the contact portion 5113 in a plan view of the second top wall main surface 412 of the lid 4 is directed by the first fixing portion 111 and the first guide portion 112. Even when stress is created in the state of assembly, the position at which the contact portion 5113 and the first electrode 21 are in contact with each other is maintained in the directions of the XY axes by using the first fixing portion 111 and the first guide portion 112.

After crimping, the first fixing portion 111 and the first guide portion 112 have a tunnel shape. In other words, the first fixing portion 111 and the first guide portion 112 include respective ceiling portions. For this reason, when stress is created, the terminal body 511 is inhibited from rotating in the first direction and the second direction of the Z-axis about a portion at which the first bent portion 5111 and the mount portion 523 are connected to each other by using the ceiling portion of the first fixing portion 111 and the second top wall main surface 412 of the lid 4. In other words, even when stress is created, movement (e.g., misalignment) is restricted in the direction of the Z-axis of the first bent portion 5111 and the extension portion 5114 that extends along the second top wall main surface 412 by using the first fixing portion 111.

When stress is created, the second bent portion 5112 that tilts with respect to the second top wall main surface 412 is inhibited from rotating in the first direction of the Z-axis about a portion of the terminal body 511 at which the second bent portion 5112 and the second top wall main surface 412 of the lid 4 are in contact with each other by using the ceiling portion of the first guide portion 112. In addition, as for the second bent portion 5112, tilting posture, that is, posture of the rise from the second top wall main surface 412 of the lid 4 is supported by parts of the crimped wall portions 115 that are away from the second bent portion 5112 in the second direction of the Z-axis. For this reason, when stress is created, the terminal body 511 is inhibited from rotating in the second direction of the Z-axis about the portion at which the second bent portion 5112 and the second top wall main surface 412 of the lid 4 are in contact with each other. In this way, when stress is created in the state of assembly, movement (e.g., misalignment) of the second bent portion 5112 in the direction of the Z-axis is restricted by the first guide portion 112. For this reason, movement (e.g., misalignment) of the rising portion 5116 and the contact portion 5113 that are connected to the second bent portion 5112 in the direction of the Z-axis is also restricted. In other words, the orientation of the contact portion 5113 in the direction intersecting the second top wall main surface 412 of the lid 4 is directed by the first guide portion 112.

Consequently, when the first pin terminal 51 is mounted on the lid 4 before the state of assembly, the posture of the contact portion 5113 is guided by the first guide portion 112, such that the distance from the contact portion 5113 to the second top wall main surface 412 of the lid 4 is maintained at a predetermined value in the direction of the Z-axis. Even when stress is created in the state of assembly, the position at which the contact portion 5113 and the first electrode 21 are in contact with each other can be maintained in the direction of the Z-axis by using the first guide portion 112.

As illustrated in FIG. 11 and FIG. 12, however, the fixation structure 200 in the comparative example does not include the first guide portion 112 according to the first embodiment. That is, the posture of the second bent portion 5112 in the comparative example is not supported. For this reason, when stress is created, there is a possibility that a rising part of the second bent portion 5112 in the comparative example rotates in the second direction of the Z-axis about the portion at which the second bent portion 5112 and the second top wall main surface 412 of the lid 4 are in contact with each other. As a result, the rising portion 5116 and the contact portion 5113 in comparative example that are connected to the second bent portion 5112 in the comparative example moves (e.g., misalignment) in the direction of the Z-axis. Consequently, in the comparative example, when the first pin terminal 51 is mounted on the lid 4 before the state of assembly, the distance from the contact portion 5113 to the second top wall main surface 412 of the lid 4 decreases in the direction of the Z-axis. In the state of assembly, there is a possibility that pressure that is applied by the contact portion 5113 in the comparative example to the first electrode 21 lacks, and the failure of contact between the contact portion 5113 and the first electrode 21 occurs.

According to the first exemplary embodiment, the first pin terminal 51 is thus fixed to the lid 4 at constant posture by using the first fixing portion 111 and the first guide portion 112. When the first pin terminal 51 is mounted on the lid 4 before the state of assembly, the orientation of the contact portion 5113 of the first pin terminal 51 in a plan view of the second top wall main surface 412 of the lid 4 and the orientation of the contact portion 5113 in the direction intersecting the second top wall main surface 412 of the lid 4 are directed. In other words, in this case, the orientation of the contact portion 5113 of the first pin terminal 51 is maintained in a predetermined direction of the directions of the XY axes, and the distance from the contact portion 5113 to the second top wall main surface 412 of the lid 4 is maintained at a predetermined value in the direction of the Z-axis. For this reason, the first pin terminal 51 can keep a predetermined spring force. Even when stress is created in the state of assembly, the position at which the contact portion 5113 of the first pin terminal 51 and the first electrode 21 of the diaphragm 2 are in contact with each other and the pressure that is applied by the contact portion 5113 to the first electrode 21 are maintained at a predetermined position and a predetermined value.

(Effects of Second Fixing Portion 121 and Second Guide Portion 122)

As for the second pin terminal 52, the position of the terminal body 521 with respect to the lid 4 is fixed by the second fixing portion 121 and the second guide portion 122, and the posture with respect to the lid 4 is guided by the second guide portion 122.

Specifically, the part of the extension portion 5214 and the first bent portion 5211 of the terminal body 521 are crimped by the two wall portions 125 of the second fixing portion 121. For this reason, when stress is created, movement (e.g., misalignment) of the terminal body 521 in the direction perpendicular to the center line L23 of the second fixing portion 121 is restricted on the XY plane. The third bent portion 5215 of the terminal body 521 is supported by the recessed portion of the inner circumferential surface 45 of the surrounding wall portion 42. For this reason, when stress is created, movement (e.g., misalignment) of the terminal body 521 in the direction along the center line L23 is restricted on the XY plane. For this reason, when stress is created, movement (e.g., misalignment) of the terminal body 521 with respect to the lid 4 in the directions of the XY axes is restricted. Consequently, in a plan view, the position of the terminal body 521 with respect to the lid 4 is fixed, and the orientation of the contact portion 5213 with respect to the lid 4 is maintained in a predetermined direction. In other words, the orientation of the contact portion 5213 in a plan view of the second top wall main surface 412 of the lid 4 is directed by the second fixing portion 121. Even when stress is created in the state of assembly, the position at which the contact portion 5213 and the substrate 10 are in contact with each other is maintained in the directions of the XY axes by using the second fixing portion 121.

After crimping, the second fixing portion 121 has a tunnel shape. In other words, the second fixing portion 121 includes a ceiling portion. In this way, when stress is created, movement (e.g., misalignment) is restricted in the direction of the Z-axis of the first bent portion 5211 of the terminal body 521 and the extension portion 5214 that extends along the second top wall main surface 412 by using the second fixing portion 121 and the second top wall main surface 412 of the lid 4.

As for the third bent portion 5215, the rising portion 5216, and the second bent portion 5212 that tilt with respect to the second top wall main surface 412, the rising portion 5216 that is located near the second bent portion 5212 is supported by the second guide portion 122 that is away from the second bent portion 5212 in the second direction of the Z-axis. For this reason, the tilting posture of the third bent portion 5215, the rising portion 5216, and the second bent portion 5212, that is, the posture of the rise from the second top wall main surface 412 of the lid 4 is supported. In this way, when stress is created, the terminal body 521 is inhibited from rotating in the second direction of the Z-axis about the portion at which the third bent portion 5215 and the second top wall main surface 412 of the lid 4 are in contact with each other is restricted by the support of the second guide portion 122.

In this case, the dimensions of the wall portions 125 of the second fixing portion 121 in the longitudinal direction are longer than the dimensions of the wall portions 115 of the first fixing portion 111 in the longitudinal direction. As a result, the force of the wall portions 125 of the second fixing portion 121 for restricting movement (e.g., misalignment) of the terminal body 521 in the first direction of the directions of the Z-axis is greater than that of the first fixing portion 111. For this reason, rotation of the terminal body 521 in the first direction of the Z-axis about the portion at which the third bent portion 5215 and the second top wall main surface 412 of the lid 4 are in contact with each other can be restricted by using the ceiling portion of the second fixing portion 121 even when the second guide portion 122 includes no ceiling portion. In this way, when stress is created, movement (e.g., misalignment) of the third bent portion 5215, the rising portion 5216, and the second bent portion 5212 in the direction of the Z-axis is restricted by the second guide portion 122. For this reason, movement (e.g., misalignment) of the rising portion 5218 and the contact portion 5213 that are connected to the second bent portion 5212 in the direction of the Z-axis is also restricted. In other words, the orientation of the contact portion 5113 in the direction intersecting the second top wall main surface 412 of the lid 4 is directed by the second guide portion 122.

Consequently, the posture of the contact portion 5213 is guided by the second guide portion 122 such that the distance from the contact portion to the second top wall main surface 412 of the lid 4 is maintained at a predetermined value in the direction of the Z-axis. Even when stress is created in the state of assembly, the position at which the contact portion 5213 and the substrate 10 are in contact with each other is maintained in the direction of the Z-axis by the second guide portion 122.

As illustrated in FIG. 11 and FIG. 12, however, the fixation structure 200 in the comparative example does not include the second guide portion 122 according to the first embodiment as described above. That is, the posture of the third bent portion 5215, the rising portion 5216, and the second bent portion 5212 in the comparative example is not supported. For this reason, when stress is created, there is a possibility that the third bent portion 5215, the rising portion 5216, and a rising part of the second bent portion 5212 in the comparative example rotate in the second direction of the Z-axis about the portion at which the third bent portion 5215 and the second top wall main surface 412 of the lid 4 are in contact with each other. For this reason, the rising portion 5216 and the contact portion 5213 that are connected to the second bent portion 5112 in the comparative example move (e.g., misalignment) in the direction of the Z-axis. Consequently, in the comparative example, when the first pin terminal 51 is mounted on the lid 4 before the state of assembly, the distance from the contact portion 5213 to the second top wall main surface 412 of the lid 4 decreases in the direction of the Z-axis. In the state of assembly, there is a possibility that the pressure that is applied by the contact portion 5213 in the comparative example to the first electrode 21 lacks, and the failure of contact between the contact portion 5213 and the first electrode 21 occurs.

The second pin terminal 52 is thus fixed to the lid 4 at constant posture by using the second fixing portion 121 and the second guide portion 122 according to the first embodiment. When the second pin terminal 52 is mounted on the lid 4 before the state of assembly, the orientation of the contact portion 5213 of the second pin terminal 52 in a plan view of the second top wall main surface 412 of the lid 4 and the orientation of the contact portion 5213 in the direction intersecting the second top wall main surface 412 of the lid 4 are directed. In other words, in this case, the orientation of the contact portion 5213 of the second pin terminal 52 is maintained in a predetermined direction of the directions of the XY axes, and the distance from the contact portion 5213 to the second top wall main surface 412 of the lid 4 is maintained at a predetermined value in the direction of the Z-axis. In other words, the second pin terminal 52 can have a predetermined spring force. For this reason, when stress is created in the state of assembly, the position at which the contact portion 5213 of the second pin terminal 52 and the substrate 10 of the diaphragm 2 are in contact with each other and the pressure that is applied by the contact portion 5213 to the substrate 10 are maintained at a predetermined position and a predetermined value.

Accordingly, when stress is created, the two pin terminals 5 can be inhibited from moving (e.g., misalignment) in the directions of the XYZ-axes by using the first fixing portion 111, the second fixing portion 121, the first guide portion 112, and the second guide portion 122 according to the first embodiment. As such, even when stress is created, the state of contact between the front end portions of the two pin terminals 5 and the diaphragm 2 does not change from that when no stress is created and can be maintained. The reliability of contact between the front end portions of the two pin terminals 5 and the diaphragm 2 can be improved unlike the case where the first guide portion 112 and the second guide portion 122 are not used. Consequently, variations in the sounding characteristics of the piezoelectric sounding component 1 due to a change in the state of contact between the front end portions of the two pin terminals 5 and the diaphragm 2 and the occurrence of a sound impairment due to the failure of contact between the two pin terminals 5 and the diaphragm 2 can be reduced. That is, the fixation guide structure 100 according to the first embodiment enables a piezoelectric sounding component that can have good reliability to be provided.

Additional Exemplary Embodiments of Fixation Guide Structure 100

Figure 7:
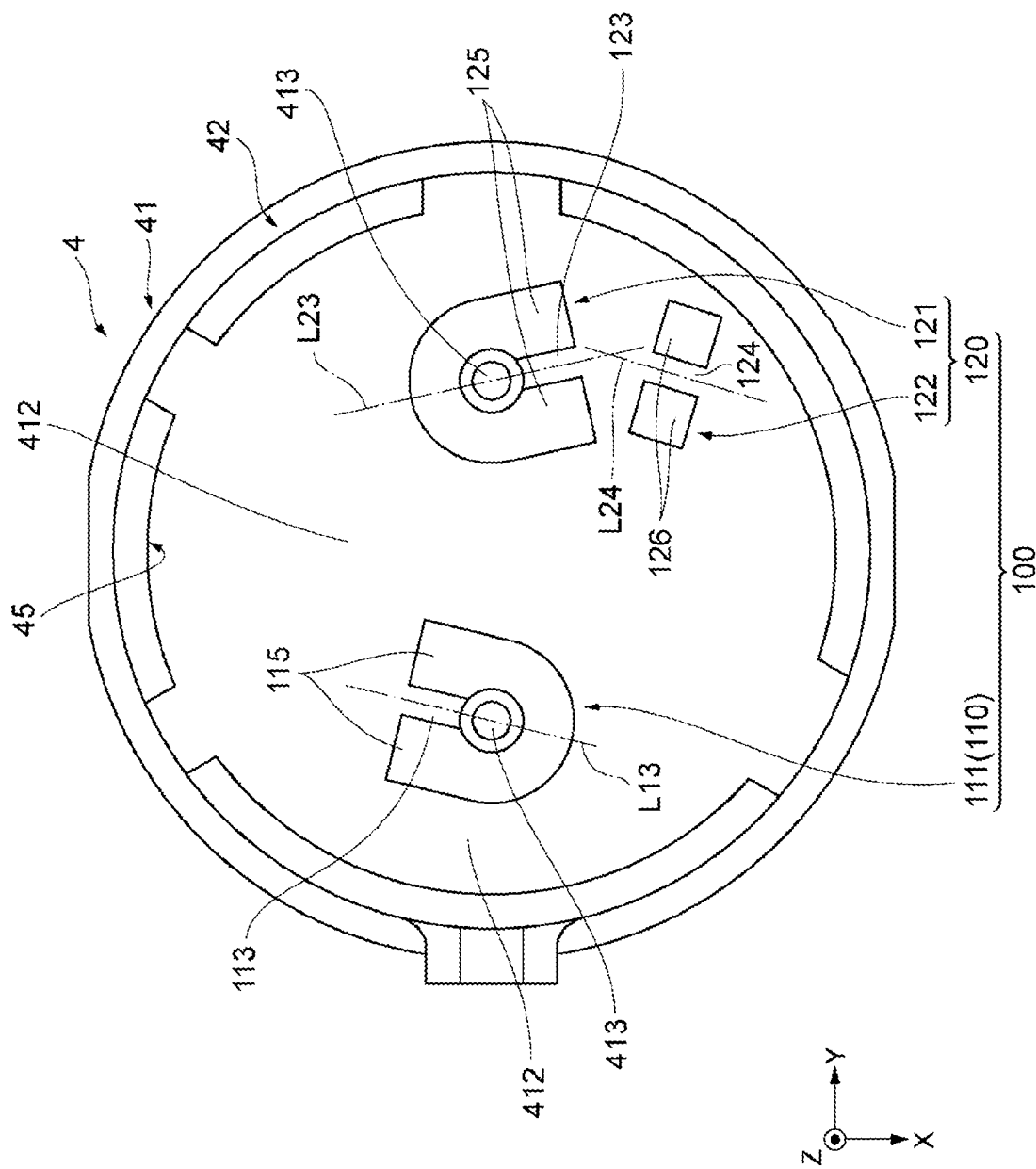
FIG. 7 is a diagram for describing a fixation guide structure of a lid according to a second exemplary embodiment.
Figure 8:
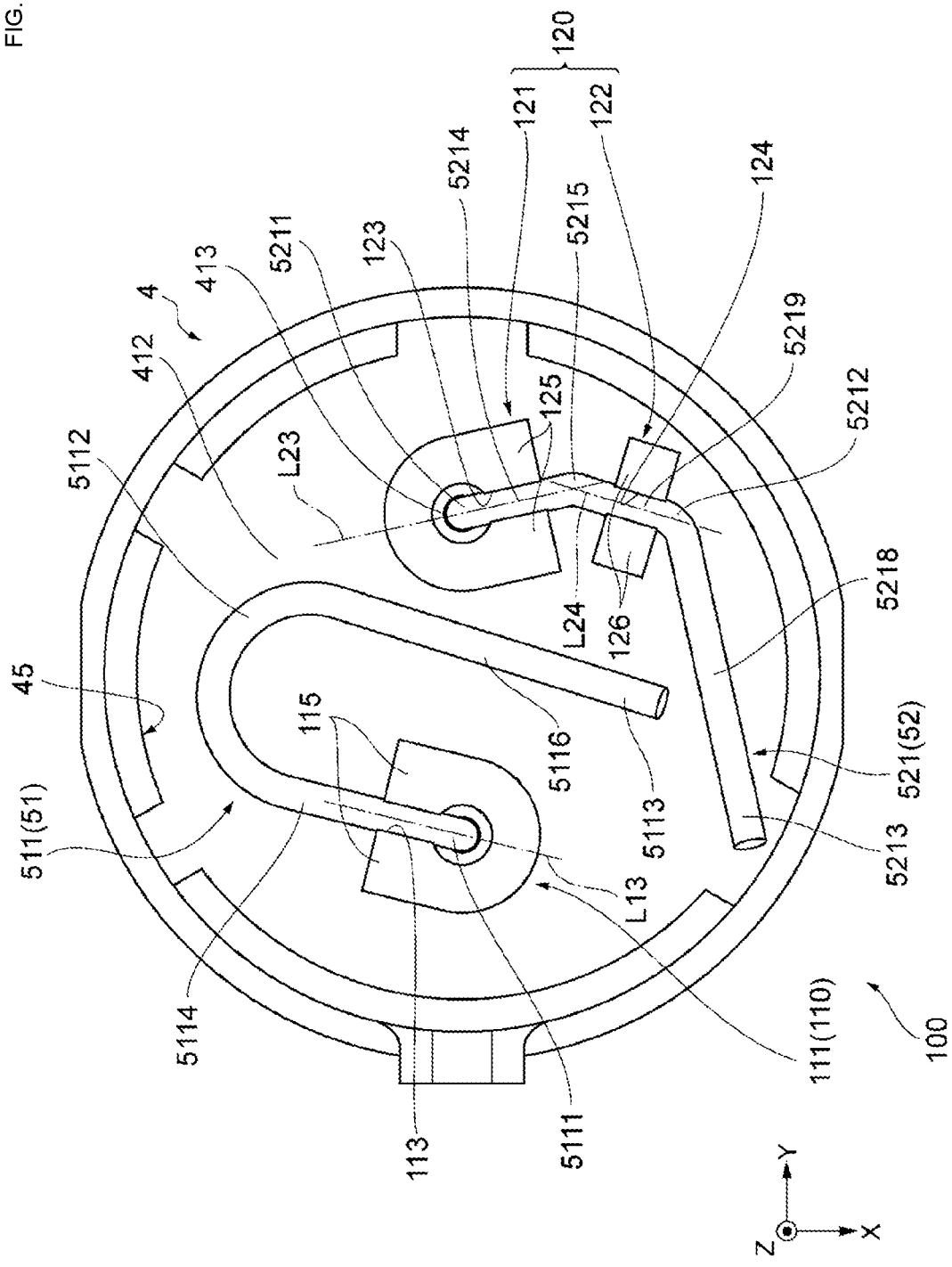
FIG. 8 is a diagram for describing the state of assembly of pin terminals and the lid according to the second exemplary embodiment.
Figure 9:
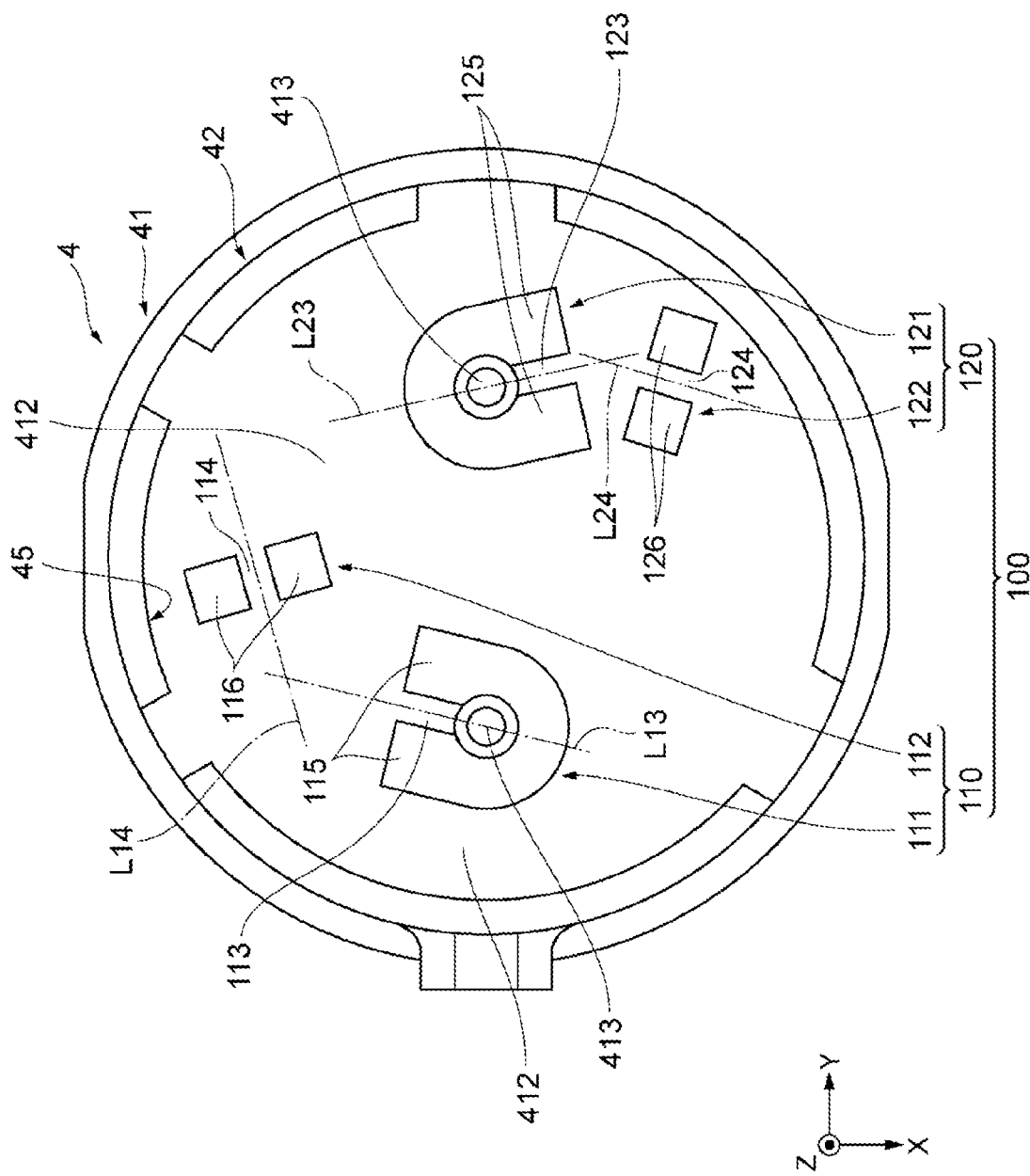
FIG. 9 is a diagram for describing a fixation guide structure of a lid according to a third exemplary embodiment.
Figure 10:
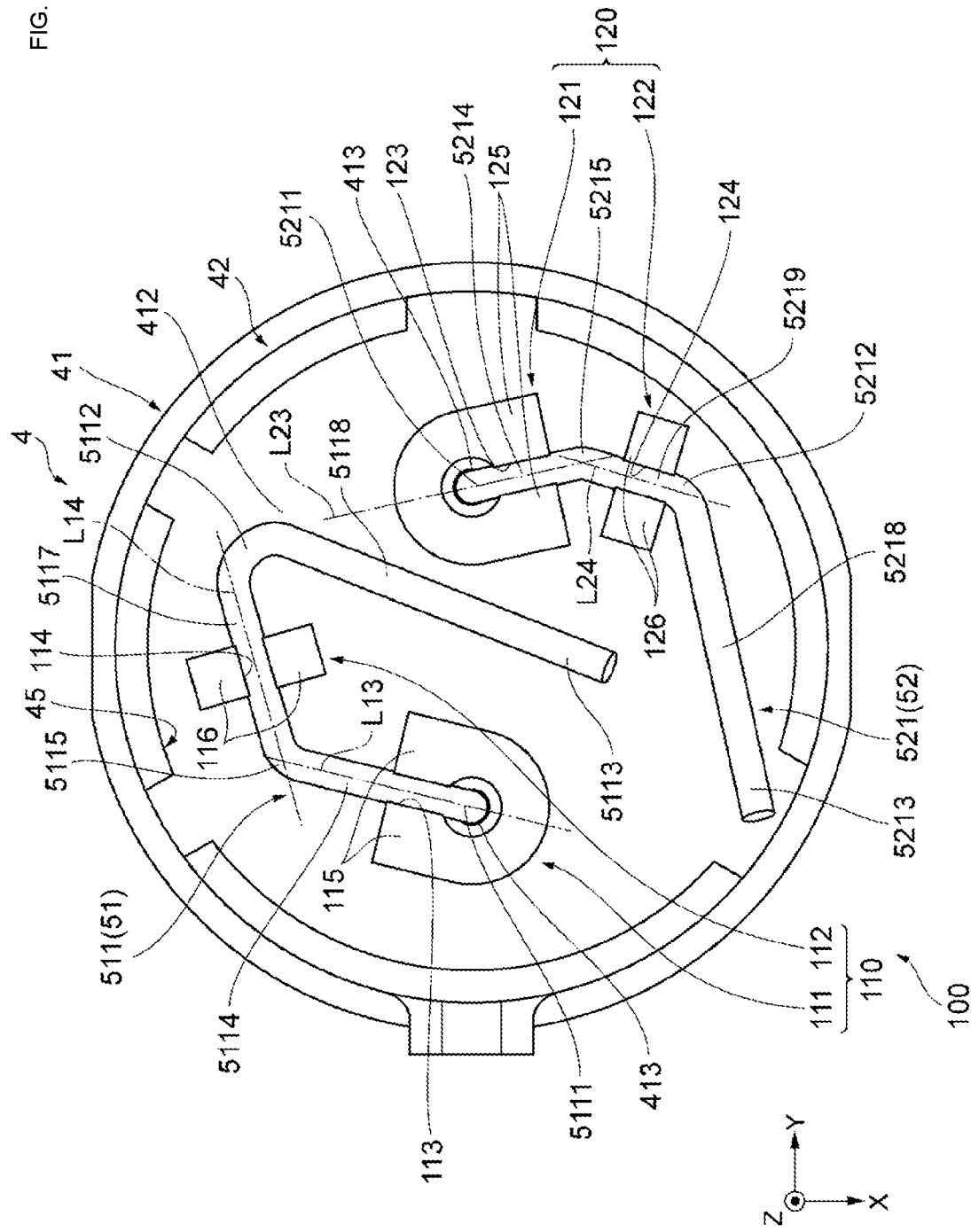
FIG. 10 is a diagram for describing the state of assembly of pin terminals and the lid according to the third exemplary embodiment.

Structures according to additional exemplary embodiments of the fixation guide structure 100 will now be described with reference to FIG. 7 to FIG. 10. FIG. 7 is a diagram for describing a fixation guide structure 100 of a lid 4 according to a second exemplary embodiment. FIG. 8 is a diagram for describing an example of the state of assembly of two pin terminals 5 and the lid 4 according to the second exemplary embodiment. FIG. 9 is a diagram for describing a fixation guide structure 100 of a lid 4 according to a third exemplary embodiment. FIG. 10 is a diagram for describing the state of assembly of two pin terminals 5 and the lid 4 according to the third exemplary embodiment.

In the following description, the description of matters according to the second embodiment and the third embodiment common to those according to the first embodiment is omitted, and only differences will be described. In particular, the same actions and effects achieved by the same structures are not repeated herein.

Second Exemplary Embodiment

The structure of the fixation guide structure 100 of the lid 4 according to the second embodiment will now be described with reference to FIG. 7 and FIG. 8. As illustrated in FIG. 7 and FIG. 8, the structure of the fixation guide structure 100 and a second pin terminal 52 according to the second embodiment differs from the structure of the fixation guide structure 100 and the second pin terminal 52 according to the first embodiment.

Specifically, as for the fixation guide structure 100 according to the second embodiment, a first fixation guide structure 110 does not include the first guide portion 112 of the first fixation guide structure 110 according to the first embodiment. A second fixation guide structure 120 according to the second embodiment differs from the second fixation guide structure 120 according to the first embodiment.

Moreover, as for the second fixation guide structure 120 according to the second embodiment, the dimensions of two wall portions 125 of the second fixing portion 121 in the longitudinal direction are shorter than the dimensions of the two wall portions 125 of the second fixing portion 121 according to the first embodiment in the longitudinal direction. A second guide portion 122 according to the second embodiment includes two wall portions 126 and has a gap 124 that is formed between the two wall portions 126. In a plan view, the center line L24 of the gap 124 is formed such that the second fixing portion 121 according to the second embodiment intersects the center line L23 of the gap 123.

As illustrated in FIG. 8, a terminal body 521 of the second pin terminal 52 according to the second embodiment includes the first bent portion 5211, the extension portion 5214 that straightly extends, the third bent portion 5215, an extension portion 5219 that straightly extends, the second bent portion 5212, the rising portion 5218 that straightly extends, and the contact portion 5213 in the lead wire extension directions. In other words, the terminal body 521 according to the second embodiment start to tilt from the second bent portion 5212 with respect to the second top wall main surface 412 in the second direction of the Z-axis unlike the terminal body 521 according to the first embodiment.

According to the second embodiment, the second guide portion 122 is thus used only for the second pin terminal 52, and the structure of the fixation guide structure 100 can be consequently simplified. The second guide portion 122 according to the second embodiment has a structure similar to that of the first guide portion 112 according to the first embodiment. For this reason, when stress is created, the terminal body 521 is inhibited from rotating in the first direction and the second direction of the Z-axis about the portion at which the second bent portion 5212 and the second top wall main surface 412 are in contact with each other by using the ceiling portion of the second guide portion 122 crimped and the two wall portions 126 of the second guide portion 122 crimped. For this reason, when stress is created, movement (e.g., misalignment) is restricted in the direction of the Z-axis of the first bent portion 5111 and the extension portion 5114 that extends along the second top wall main surface 412 by using the second guide portion 122 even when the dimensions of the two wall portions 125 of the second fixing portion 121 according to the second embodiment in the longitudinal direction are decreased.

In addition, the extension portion 5214 and the extension portion 5219 of the second pin terminal 52 according to the second embodiment are shorter than the extension portion 5214 and the extension portion 5219 of the second pin terminal 52 according to the first embodiment. The second guide portion 122 according to the second embodiment is disposed inside the circumferential edge of the second top wall main surface 412 at a position farther therefrom than the second guide portion 122 according to the first embodiment. According to the second embodiment, because of these, contact between the second pin terminal 52 and the inner circumferential surface 45 of the lid 4 in the state of assembly can be avoided. For this reason, the reliability of contact between the second pin terminal 52 and the substrate 10 is also improved.

Third Exemplary Embodiment

The structure of the fixation guide structure 100 of the lid 4 according to the third exemplary embodiment will now be described with reference to FIG. 9 and FIG. 10. As illustrated in FIG. 9 and FIG. 10, the structure of the second fixation guide structure 120 and the second pin terminal 52 according to the third embodiment is the same as the structure of the second fixation guide structure 120 and the second pin terminal 52 according to the second embodiment. For this reason, the description of the structure of the second fixation guide structure 120 and the second pin terminal 52 according to the third embodiment is omitted.

The structure of a first fixation guide structure 110 and a first pin terminal 51 according to the third embodiment differs from the structure of the first fixation guide structure 110 and the first pin terminal 51 according to the first embodiment and the second embodiment.

Specifically, the first fixation guide structure 110 according to the third embodiment includes a first fixing portion 111 and a first guide portion 112. The first fixing portion 111 according to the third embodiment has the same shape as that of the second fixing portion 121 according to the second embodiment, and the first guide portion 112 has the same shape as that of the second guide portion 122 according to the second embodiment.

As illustrated in FIG. 10, a terminal body 511 of the first pin terminal 51 according to the third embodiment includes the first bent portion 5111, the extension portion 5114 that straightly extends, the third bent portion 5115, an extension portion 5117 that straightly extends, the second bent portion 5112, a rising portion 5118 that straightly extends, and the contact portion 5113 in the lead wire extension directions. The terminal body 521 according to the third embodiment starts to tilt from the second bent portion 5212 with respect to the second top wall main surface 412 in the second direction.

As for the first guide portion 112 according to the third embodiment, in the state of assembly, the extension portion 5117 that straightly extends along the second top wall main surface 412 is crimped unlike to the first guide portion 112 according to the first embodiment.

According to the third embodiment, the first guide portion 112 and the second guide portion 122 are thus used for the first pin terminal 51 and the second pin terminal 52. Consequently, when stress is created, the terminal body 511 is inhibited from rotating in the first direction and the second direction of the Z-axis about the portion at which the second bent portion 5112 and the second top wall main surface 412 are in contact with each other with certainty, and the terminal body 521 can be inhibited from rotating in the first direction and the second direction of the Z-axis about the portion at which the second bent portion 5212 and the second top wall main surface 412 are in contact with each other. For this reason, the reliability of contact between the second pin terminal 52 and the substrate 10 is improved.

According to the third embodiment, as for the first guide portion 112, the extension portion 5117 that straightly extends along the second top wall main surface 412 is crimped, and the posture of the extension portion 5117 can be supported with certainty. For this reason, the posture of the second bent portion 5112 that is connected to the extension portion 5117, the rising portion 5118 that straightly extends, and the contact portion 5113 can be guided such that these rise from the second top wall main surface 412 with certainty.

In general, it is noted that the embodiments of the present invention are described above by way of example. The piezoelectric sounding component 1 according to an embodiment of the present invention includes the diaphragm 2 that vibrates when a voltage is applied thereto, the case 6 that includes the case body 3 having the cavity 33 and the lid 4 disposed such that the lid 4 closes the cavity 33 of the case body 3 and that contains the diaphragm 2 in the interior space 30 that is formed by the case body 3 and the lid 4, and the two pin terminals 5 that are disposed on the lid such that the two pin terminals 5 are in contact with the diaphragm 2. At least one of the pin terminals 5 includes the extended portion 512 (or the extended portion 522) that extends from the interior space to the outside, the extension portion 5114 (or the extension portion 5214) that extends along the second top wall main surface 412 of the lid 4 in the interior space 30, the rising portion 5116 (or the rising portion 5216) that rises from the extension portion 5114 (or the extension portion 5214), and the contact portion 5113 (or the contact portion 5213) that is disposed at an end of the rising portion 5116 (or the rising portion 5216) and that is in contact with the diaphragm 2. Moreover, the first fixing portion 111 (or the second fixing portion 121) that fixes the position of the first bent portion 5111 (or the first bent portion 5211) between the extended portion 512 (or the extended portion 522) and the extension portion 5114 (or the extension portion 5214) and the first guide portion 112 (or the second guide portion 122) that is in contact with the second bent portion 5112 (or the second bent portion 5212) between the extension portion 5114 (or the extension portion 5214) and the rising portion 5116 (or the rising portion 5216) or a portion near the second bent portion 5112 (or the second bent portion 5212) and that guides the posture of the pin terminal 5 are on a surface of the lid 4 that faces the interior space 30. With the structure described above, good reliability can be obtained.

In the structure described above, the first fixing portion 111 (or the second fixing portion 121) can be configured to direct at least orientation of the contact portion 5113 (or the contact portion 5213) of the pin terminal 5 in a plan view of the second top wall main surface 412 of the lid 4. With the structure described above, misalignment of the orientation of the contact portion of the pin terminal in a plan view of the main surface of the lid is inhibited, and the reliability of connection regarding the contact portion is improved.

In the structure described above, the first guide portion 112 (or the second guide portion 122) can be configured to direct at least orientation of 5113 (or the contact portion 5213) of the pin terminal 5 in the direction intersecting the second top wall main surface 412 of the lid 4. With the structure described above, misalignment of the orientation of the contact portion of the pin terminal in the direction intersecting the main surface of the lid is inhibited, and the reliability of connection regarding the contact portion is improved.

In the structure described above, the first fixing portion 111 (or the second fixing portion 121) and the first guide portion 112 (or the second guide portion 122) can be disposed at different positions in a plan view of the second top wall main surface 412 of the lid 4. With the structure described above, misalignment of the pin terminal is inhibited by fixation and support at the different positions.

In the structure described above, the first guide portion 112 (or the second guide portion 122) can be disposed at a position nearer than the first fixing portion 111 (or the second fixing portion 121) to the circumferential edge of the second top wall main surface 412 of the lid 4. With the structure described above, the reliability of connection regarding the contact portion can be improved by support at a position at which misalignment of the orientation of the contact portion of the pin terminal in the direction intersecting the main surface of the lid is likely to occur.

In the structure described above, the lid 4 can have the through-hole 413 in which the pin terminal 5 is inserted, and the first fixing portion 111 (or the second fixing portion 121) can be disposed around the opening of the through-hole 413 of the lid 4. With the structure described above, misalignment of the orientation of the contact portion of the pin terminal in a plan view of the main surface of the lid is inhibited with certainty.

In the structure described above, the first fixing portion 111 (or the second fixing portion 121) can have the gap 113 (or the gap 123) that is an example of a fixing portion gap for inserting the pin terminal 5, and the first guide portion 112 (or the second guide portion 122) can be disposed at a position away from a line on which the gap 113 (or the gap 123) extends in a plan view of the second top wall main surface 412 of the lid 4. With the structure described above, the reliability of contact is improved by fixation and support at different positions.

In the structure described above, the first guide portion 112 (or the second guide portion 122) can have the gap 114 (or the gap 124) that is an example of a guide portion gap for inserting the pin terminal 5, and a line on which the gap 114 (or the gap 124) extends can intersect the line on which the gap 113 (or the gap 123) extends in a plan view of the second top wall main surface 412 of the lid 4. With the structure described above, misalignment of the pin terminal is inhibited with certainty, and good reliability is obtained.

In the structure described above, the second bent portion 5112 (or the second bent portion 5212) or the portion near the second bent portion 5112 (or the second bent portion 5212) can be disposed so as to be crimped or supported by the first guide portion 112 (or the second guide portion 122). With the structure described above, misalignment of the orientation of the contact portion of the pin terminal in the direction intersecting the main surface of the lid is inhibited, and the reliability of connection regarding the contact portion is improved.

Modification

It is noted that the exemplary embodiments of the present invention are not limited to the embodiments described above, but can be modified in various ways for application. A modification according to the present invention will now be described.

In the description according to the embodiments described above, the fixation guide structure 100 protrudes from the second top wall main surface 412 of the lid 4, but is not limited by the structure described above. For example, in an alternative aspect, the fixation guide structure 100 can protrude from the first top wall main surface 411 of the lid 4.

In the description according to the embodiments described above, the number of the first fixing portion 111 and the number of the second fixing portion 121 are 1, but are not limited by the structure described above. For example, the number of the first fixing portion 111 and the number of the second fixing portion 121 may be 2 or more in alternative aspects. Similarly, in the description according to the embodiments described above, the number of the first guide portion 112 and the number of the second guide portion 122 are 0 or 1, but are not limited by the structure described above. For example, the number of the first guide portion 112 and the number of the second guide portion 122 can be 2 or more. For example, the number of the first fixing portion 111, the number of the second fixing portion 121, the number of the first guide portion 112, and the number of the second guide portion 122 may differ depending on the shapes of the pin terminals 5.

In the description according to the embodiments described above, the first fixing portion 111 and the first guide portion 112 are isolated from each other, but are not limited by the structure described above. For example, in an alternative aspect, the first fixing portion 111 and the first guide portion 112 may have an integrated structure. Similarly, in the description according to the embodiments described above, the second fixing portion 121 and the second guide portion 122 are isolated from each other but are not limited by the structure described above. For example, the second fixing portion 121 and the second guide portion 122 can have an integrated structure.

In the description according to the embodiments described above, the number of the pin terminals 5 is 2, but is not limited by the structure described above. For example, the number may be a numeral other than 2. In the description according to the embodiments described above, the first pin terminal 51 and the second pin terminal 52 have different structures but are not limited by the structures described above. For example, the first pin terminal 51 and the second pin terminal 52 may have the same structure in an alternative aspect. For example, the first pin terminal 51 and the second pin terminal 52 may have structures that differ from the structures described above.

In the description according to the embodiments described above, the diaphragm 2 includes the second electrode 22, but is not limited by the structure described above. For example, the substrate 10 can be used as a component that has the function of the second electrode 22 instead of the second electrode 22.

In the description according to the embodiments described above, the shape of each component of the piezoelectric sounding component 1 in a plan view is a circular shape, but is not limited by the structure described above. For example, a freely selected shape such as a rectangular shape or a square shape may be used in alternative aspects.

The exemplary embodiments are described above to make the present invention easy to understand and do not limit the present invention. The present invention can be modified and altered without departing from the spirit thereof. The present invention includes equivalents. That is, embodiments obtained by appropriately modifying the embodiments by a person skilled in the art are included in the scope of the present invention, provided that the embodiments have the features of the present invention. For example, the components according to the embodiments, the arrangement thereof, the material, conditions, shape, and size are not limited to those described above by way of example and can be appropriately changed. It goes without saying that the embodiments are described by way of example, and that the components according to the different embodiments can be partially replaced or combined. These having the features of the present invention are also included in the scope of the present invention.

REFERENCE SIGNS LIST

1 . . . piezoelectric sounding component, 2 . . . diaphragm, 3 . . . case body, 4 . . . lid, 5 . . . pin terminal, 6 . . . case, 10 . . . substrate, 20 . . . vibration element, 21 . . . first electrode, 22 . . . second electrode, 23 . . . piezoelectric plate, 51 . . . first pin terminal, 52 . . . second pin terminal, 100 . . . fixation guide structure, 110 . . . first fixation guide structure, 111 . . . first fixing portion, 112 . . . first guide portion, structure, 120 . . . second fixation guide structure, 121 . . . second fixing portion, 122 . . . second guide portion

The invention claimed is:
1. A piezoelectric sounding component comprising:
a diaphragm including a substrate and a vibration element having a piezoelectric plate and a pair of electrodes disposed on opposing surfaces of the piezoelectric plate, which is configured to vibrate when a voltage is applied to the pair of electrodes;
a case that includes a case body having an opening and a lid disposed to close the opening of the case body, such that the diaphragm is disposed in an interior space thereof; and
two pin terminals disposed on the lid and in contact with the diaphragm,
wherein at least one pin terminal of the pin terminals includes an extended portion that extends from the interior space towards an outside thereof, an extension portion that extends along a main surface of the lid in the interior space, a rising portion that rises from the extension portion, and a contact portion at an end of the rising portion that contacts the diaphragm,
wherein a fixing portion is configured to fix a position of a first bent portion of the at least one pin terminal between the extended portion and the extension portion, wherein a guide portion is in contact with a second bent portion of the at least one pin terminal that is between the extension portion and the rising portion, the guide portion having two wall portions that are crimped towards each other and do not contact each other such that the second bent portion is disposed therebetween and the guide portion is configured to guide a posture of the at least one pin terminal, and wherein the fixing portion and the guide portion are on a surface of the lid that faces the interior space.

2. The piezoelectric sounding component according to claim 1, wherein the two pin terminals are in direct physical contact with the diaphragm.

3. The piezoelectric sounding component according to claim 1, wherein the fixing portion is configured to direct at least an orientation of the contact portion of the at least one pin terminal in a plan view of the main surface of the lid.

4. The piezoelectric sounding component according to claim 1, wherein the guide portion is configured to direct at least an orientation of the contact portion of the at least one pin terminal in a direction intersecting the main surface of the lid.

5. The piezoelectric sounding component according to claim 1, wherein the fixing portion and the guide portion are disposed at different positions in a plan view of the main surface of the lid.

6. The piezoelectric sounding component according to claim 1, wherein the guide portion is disposed at a position nearer to a circumferential edge of the main surface of the lid than the fixing portion.

7. The piezoelectric sounding component according to claim 1, wherein the lid has at least one through-hole in which the pin terminals are inserted, and the fixing portion is disposed around an opening of the through-hole of the lid.

8. The piezoelectric sounding component according to claim 1, wherein the fixing portion has a fixing portion gap for inserting the pin terminals.

9. The piezoelectric sounding component according to claim 8, wherein the guide portion is disposed at a position away from a line on which the fixing portion gap extends in a plan view of the main surface of the lid.

10. The piezoelectric sounding component according to claim 9, wherein the guide portion has a guide portion gap for inserting the at least one pin terminal, and a line on which the guide portion gap extends intersects the line on which the fixing portion gap extends in a plan view of the main surface of the lid.

11. The piezoelectric sounding component according to claim 1, wherein the two pin terminals are configured to apply an alternating voltage to the pair of electrodes of the vibration element.

12. The piezoelectric sounding component according to claim 1, wherein the lid includes a surrounding wall extending towards the case body and having an inner circumferential surface that extends outwardly from the diaphragm.

13. A piezoelectric sounding component comprising:
a case having a case body and a lid coupled thereto to define an interior space with a piezoelectric diaphragm disposed therein, the piezoelectric diaphragm having a pair of electrodes disposed on opposing surfaces thereof; and
a pair of pin terminals disposed on the lid and in contact with the diaphragm,
wherein at least one pin terminal of the pair pin terminals includes an extended portion that extends from the interior space through the lid, an extension portion that extends along a main surface of the lid in the interior space, and a rising portion that extends from the extension portion and has a contact portion at an end thereof for contacting the diaphragm,
wherein the main surface of the lid includes a fixing portion constructed to secure a first bend portion of the at least one pin terminal between the extended portion and the extension portion, and
wherein the main surface of the lid further includes a guide portion contacts a second bend portion of the at least one pin terminal that is between the extension portion and the rising portion, the guide portion having two wall portions crimped towards each other with the second bend portion disposed therebetween, such that the guide portion is configured to guide the rising portion towards the diaphragm.

14. The piezoelectric sounding component according to claim 13, wherein the pair of pin terminals are in direct physical contact with the diaphragm.

15. The piezoelectric sounding component according to claim 13, wherein the fixing portion is configured to direct at least an orientation of the contact portion of the at least one pin terminal in a plan view of the main surface of the lid.

16. The piezoelectric sounding component according to claim 13, wherein the guide portion is configured to direct at least an orientation of the contact portion of the at least one pin terminal in a direction intersecting the main surface of the lid.

17. The piezoelectric sounding component according to claim 13, wherein the fixing portion and the guide portion are disposed at different positions in a plan view of the main surface of the lid.

18. The piezoelectric sounding component according to claim 13, wherein the guide portion is disposed at a position nearer to a circumferential edge of the main surface of the lid than the fixing portion.

19. The piezoelectric sounding component according to claim 1, wherein a center line extending in a gap between the two wall portions of the guide portion bends to guide the posture of the at least one pin terminal.

20. The piezoelectric sounding component according to claim 13, wherein a center line extending in a gap between the two wall portions of the guide portion bends to guide the rising portion towards the diaphragm.

* * * * *